United States Patent [19]
Haller et al.

[11] Patent Number: 6,011,810
[45] Date of Patent: Jan. 4, 2000

[54] DOPING OF GERMANIUM AND SILICON CRYSTALS WITH NON-HYDROGENIC ACCEPTORS FOR FAR INFRARED LASERS

[75] Inventors: Eugene E. Haller, Berkeley, Calif.; Erik Brundermann, Berlin, Germany

[73] Assignee: The Regents of the University of California, Oakland, Calif.

[21] Appl. No.: 08/840,601

[22] Filed: Apr. 22, 1997

Related U.S. Application Data

[60] Provisional application No. 60/016,069, Apr. 23, 1996.

[51] Int. Cl.$^7$ ........................................................ H01S 3/19
[52] U.S. Cl. ................................ 372/45; 372/43; 372/26; 372/37; 257/607
[58] Field of Search .................................. 372/45, 43, 26, 372/37; 257/607

[56] References Cited

U.S. PATENT DOCUMENTS

| | | | |
|---|---|---|---|
| 3,624,553 | 11/1971 | Van-Tran | 372/43 |
| 5,784,397 | 7/1998 | Kim et al. | 372/43 |

OTHER PUBLICATIONS

Brundermann, E. et al., "Miniaturization of p–Ge Lasers: Progress Toward Continuous Wave Operation", Appl. Phys. Lett., 68 (10), pp. 1359–1361, Mar. 4, 1996.

Aslanov, G. A. et al., "Nonlinearity of the Photoconductivity of Germanium Doped with Mercury, Cobalt, and Zinc and Excited with (lambda)=10.6–(mu) m Radiation", Semiconductors 27 (2), pp. 154–157, Feb. 1993.

E. Bründermann, et al., Double Acceptor Doped Ge: A New Medium For Inter–valence–band Lasers, *Appl. Phys. Lett.*, 68 (22) 3075–3077, (May 27, 1996).

Susumu Komiyama, et al., Polarization of the Far–infrared Laser Oscillation in p–Ge in Faraday Configuration, *J. Appl. Phys.*, 62 (9) 3552–3558, (Nov. 1, 1987).

E. Bründermann, et al., Tunable Solid State P–Type Germanium Laser in the Frequency Range From 1 to 4 THz, *Proc. 30th ESLAB Symp.*, 175–177 (Sep. 1996).

G. Sirmain, et al., Stimulated Far–Infrared Emission From Copper–doped Germanium Crystals, *Appl. Phys. Lett.*, 70 (13), 1659–1661 (Mar. 31, 1997).

O. D. Dubon, et al., Terahertz Emission From p–Type Germanium Lasers Doped With Novel Acceptors, LBNL–39888, 1–7, *Proc. 8th Int'l Symp. on Space Terahertz Technology*, (Mar. 1997).

*Primary Examiner*—Rodney Bovernick
*Assistant Examiner*—Sung T. Kim
*Attorney, Agent, or Firm*—Hana Verny

[57] ABSTRACT

A method for doping semiconductors used for far infrared lasers with non-hydrogenic acceptors having binding energies larger than the energy of the laser photons. Doping of germanium or silicon crystals with beryllium, zinc or copper. A far infrared laser comprising germanium crystals doped with double or triple acceptor dopants permitting the doped laser to be tuned continuously from 1 to 4 terahertz and to operate in continuous mode. A method for operating semiconductor hole population inversion lasers with a closed cycle refrigerator.

27 Claims, 20 Drawing Sheets

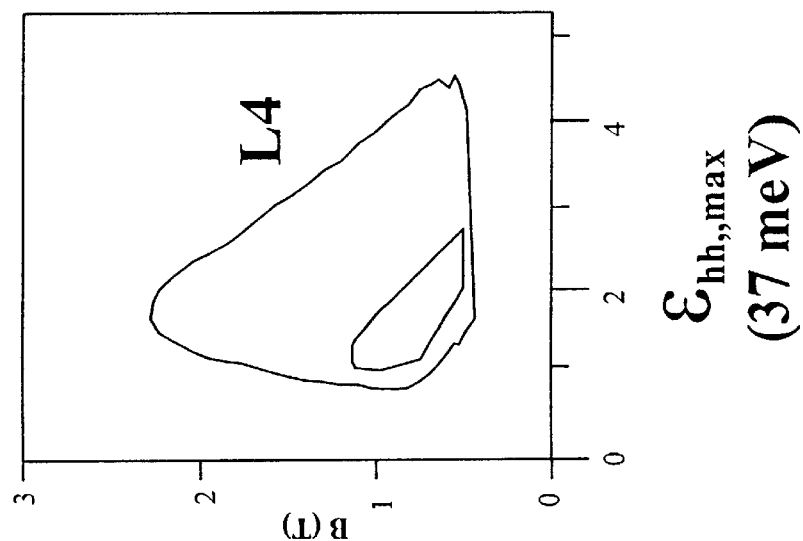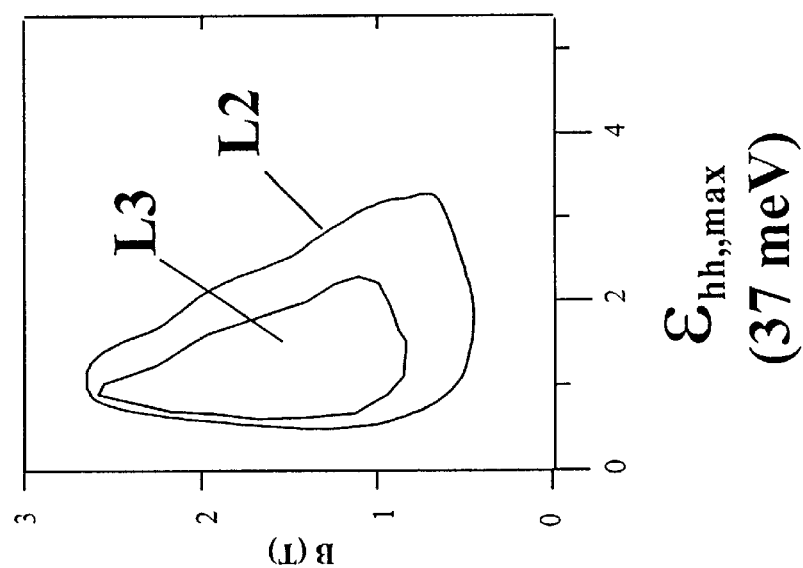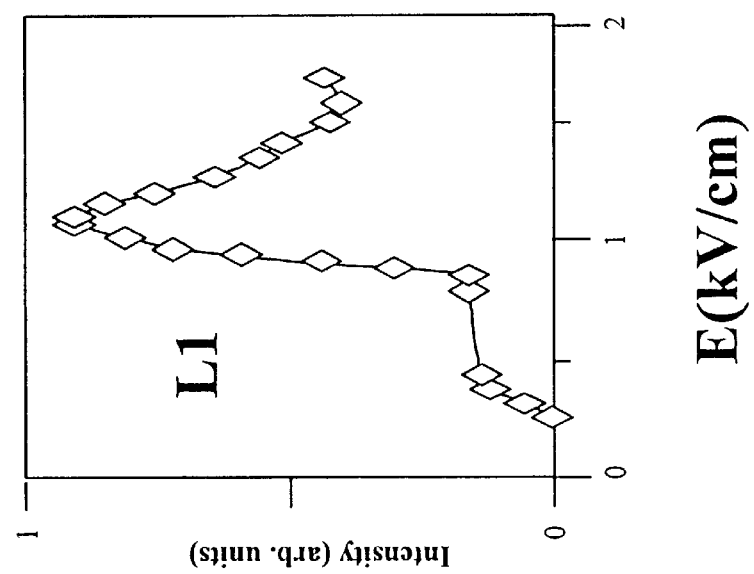

DOPING OF GERMANIUM AND SILICON CRYSTALS WITH NON-HYDROGENIC ACCEPTORS FOR FAR INFRARED LASERS

This application is based on and claims priority of U.S. Provisional Application Ser. No. 60/016,069 filed on Apr. 23, 1996.

This invention was developed under contract No. DE-AC03-76SF00098 between the United States Department of Energy and the University of California. The U.S. Government has certain rights in the invention.

BACKGROUND OF THE INVENTION

1. Field of the Invention

The current invention concerns a method for doping semiconductors used for far infrared hot hole lasers with non-hydrogenic acceptors having binding energies larger than the energy of the laser photons. In particular, the invention involves doping of germanium or silicon crystals with non-hydrogenic acceptor dopants beryllium, zinc or copper introduced into germanium crystals through melt or diffusion. These acceptors do not absorb the laser radiation internally and therefore do not affect laser action. The acceptor dopants allow building of smaller more compact lasers with reduced power dissipation resulting in slower self-heating and much longer pulse lengths. The invention further concerns a far infrared laser comprising germanium crystals doped with double or triple acceptor dopants permitting the doped laser to be tuned continuously from 1 to 4 terahertz and to operate in continuous mode.

BACKGROUND AND RELATED DISCLOSURES

A strong interest exists in a tunable, solid state and continuous wave far-infrared laser. Specifically, lasers tunable from 1 to 4 terahertz (THz) would have wide application and would be particularly valuable as local oscillators in heterodyne receivers for the study of far-infrared rotational transitions of molecules in starforming regions in atmospheric research, astrophysics, cosmology, solid state physics, chemistry and material testing.

The active solid state media able to generate continuous signals in the spectral range between the laser radiation of the infrared domain and the cyclotron radiation of the microwave domains are currently not available. The inability to generate continuous signals over the whole spectral range has been described in *Sov. Phys. Semicond.,* 21:701 (1987). The spectral range which includes frequencies in the terahertz (THz) range is called the far infrared (FIR) range. Currently, the detection of faint astronomical signals in the far infrared is only possible above the troposphere, because such signals are absorbed in the atmosphere at sea level due to strong water absorption lines. Such signals, therefore, may only be measured by aircraft, satellites, or other platforms which can carry detecting equipment above the troposphere. The limited space, power and time of flight available for operation of such detectors requires that the far infrared range (FIR) laser be compact, operate in a continuous wave mode, and have low power consumption. Such lasers are currently either not available or are greatly inefficient.

Research on FIR lasers has been conducted since the 1980s with pulsed p-type germanium lasers operating in crossed electric and magnetic fields at liquid helium temperature. Thus far, all spectral investigations have been performed with germanium crystals doped with shallow hydrogenic acceptors, all of which exhibit internal hole transitions that partially overlap in energy with intervalence band (IVB) transitions. The interference of dopant absorption and lasing has made the interpretation of the emission spectrum very complicated often leading to speculative assignments of the hole transitions responsible for stimulated emission.

A review of the current status of far-infrared semiconductor lasers is found in *Optical and Quantum Electronics,* 23(2): S111–S341 (1991), Special Issue of Far-Infrared Semiconductor Lasers, Ed. E. Gornik, Chapman & Hall, Ltd., London, Great Britain.

The emission spectrum of light to heavy hole transition p-germanium lasers for germanium-gallium is described in *Semicond. Sci. Technol.,* 9:638 (1994).

Laser action in far-infrared devices is based on an inversion of the hole population between the light and heavy hole bands, known as intervalence band (IVB) transitions, or within the light hole band, in the form of cyclotron resonance (CR) transitions between light-hole Landau levels. Previous research has been successful at producing FIR lasers which possess several of the desired features, such as some limited tunability between 1 and 4 THz, single line operation with mode linewidths on the order of one Mhz, and high output powers of several watts.

Unfortunately, even these somehow improved lasers are pulsed, and operate only with a low duty cycle of $10^{-5}$, as described in *Opt. Quantum Electron.,* 23: S111 (1991). Furthermore, the emission spectrum over this range has a gap, as described above, and therefore falls either into a low frequency range from 1.0 to 1.8 THz or in a high frequency range from 2.4 to 4 THz but not into the frequency range in between these two ranges. Consequently, these prior art lasers are only partially tunable over the 1–4 THz range.

One reason for the above-identified limitations lies in the fact that prior art FIR lasers use shallow hydrogenic dopants, primarily gallium, to form a free hole current in germanium. Unfortunately, gallium acceptors also absorb much of the internally generated phonon energy. This renders lasing impossible in the 1.8–2.4 THz range. This arrangement requires a high electrical power to be input into the germanium crystal, typically on the order of 100 W/mm$^3$, in order to produce acceptable output lasing. At such high electrical input powers resistive crystal heating occurs. Such heating becomes a serious problem necessitating and allowing only the use of short duration pulses. As a result, these shallow acceptor dopants result in lasing only at such low duty cycles.

It would, therefore, be advantageous to have lasers available which would be compact, tunable over the whole far infrared spectrum from 1 to 4 THz and able to operate under the low electrical power consumption allowing uninterrupted, that is continuous wave, lasing.

Recently, during the development of this invention, the repetition rate of a gallium-doped germanium laser was increased up to 250 Hz and the duty cycle was improved by one order of magnitude to $1.3 \times 10^{-4}$. The power consumption during the electric pulse was reduced from 20 to 2 kW by decreasing the active volume of an aluminum-doped germanium laser by one order of magnitude to 0.025 cm$^3$. The duty cycle was conserved by connecting a copper heat sink to one surface of the germanium crystal.

Although somewhat improved, clearly these lasers still do not meet requirements for lasers needed for the above-described purposes.

It would, therefore, be desirable to develop a far infrared laser which is tunable, of high power, compact and allows either continuous wave or high duty cycle operation. Such a laser should have low internal absorption, thereby lowering the necessary input electrical power and heat generated during lasing.

It is a primary objective of this invention to provide such lasers and the method of improving their property by providing non-standard acceptor doping agents which are non-hydrogenic and do not absorb the laser radiation internally and therefore do not affect laser action.

All patents, patent applications, and publications are hereby incorporated by reference.

SUMMARY

One aspect of the current invention is a method for fabrication of far infrared lasers comprising germanium, silicon, diamond or silicon carbide doped with beryllium, zinc, copper or other deep level dopants and other Group III-V semiconductor compounds or Group II-VI compounds and their alloys doped with appropriate dopants.

Another aspect of the current invention is a method of doping of germanium and silicon crystals with non-hydrogenic acceptors having binding energies larger than the energy of the laser photons.

Still another aspect of the invention is a method for doping germanium and silicon crystals using acceptors beryllium, zinc and copper.

Still yet another aspect of the current invention is an improved laser which is compact, tunable, high power, and is either continuous or having a high duty cycle.

Still another aspect of the current invention is a laser having low internal absorption due to doping with non-hydrogenic dopant thereby lowering the input of necessary electrical power and avoiding generating heat in lasing.

Still yet another aspect of the current invention is a laser comprising a germanium crystal doped with beryllium, zinc or copper.

BRIEF DESCRIPTION OF DRAWINGS

FIG. 3 shows laser pulse intensity of crystal L1 as a function of the electric field E at a magnetic field B (FIG. 3 A); lasing regions of crystal L2 (open region) and L3 (filled regions) as a function of maximum heavy-hole energy (hhe) expressed in units of the optical phonon energy (FIG. 3 B); and lasing region of the crystal L4 measured at a repetition rate of 1 and 500 Hz (filled area) with an applied electric pulse of 750 ns (FIG. 3 C).

FIG. 13 A shows free hole oscillation in velocity space in crossed electric (E) and magnetic (B) fields. FIG. 13 B shows free hole oscillation in the band diagram.

FIG. 14 A schematically depicts the process of optical phonon emission by heavy holes. FIG. 14 B shows infrared photon emission from the accumulated light hole population.

FIG. 18 A shows photoconductivity for gallium-doped germanium (ge:ga) and beryllium-doped germanium (Ge:Be). FIG. 18 B shows the hole energy levels for a number of elements forming acceptors in germanium.

DEFINITIONS

Figure 1:
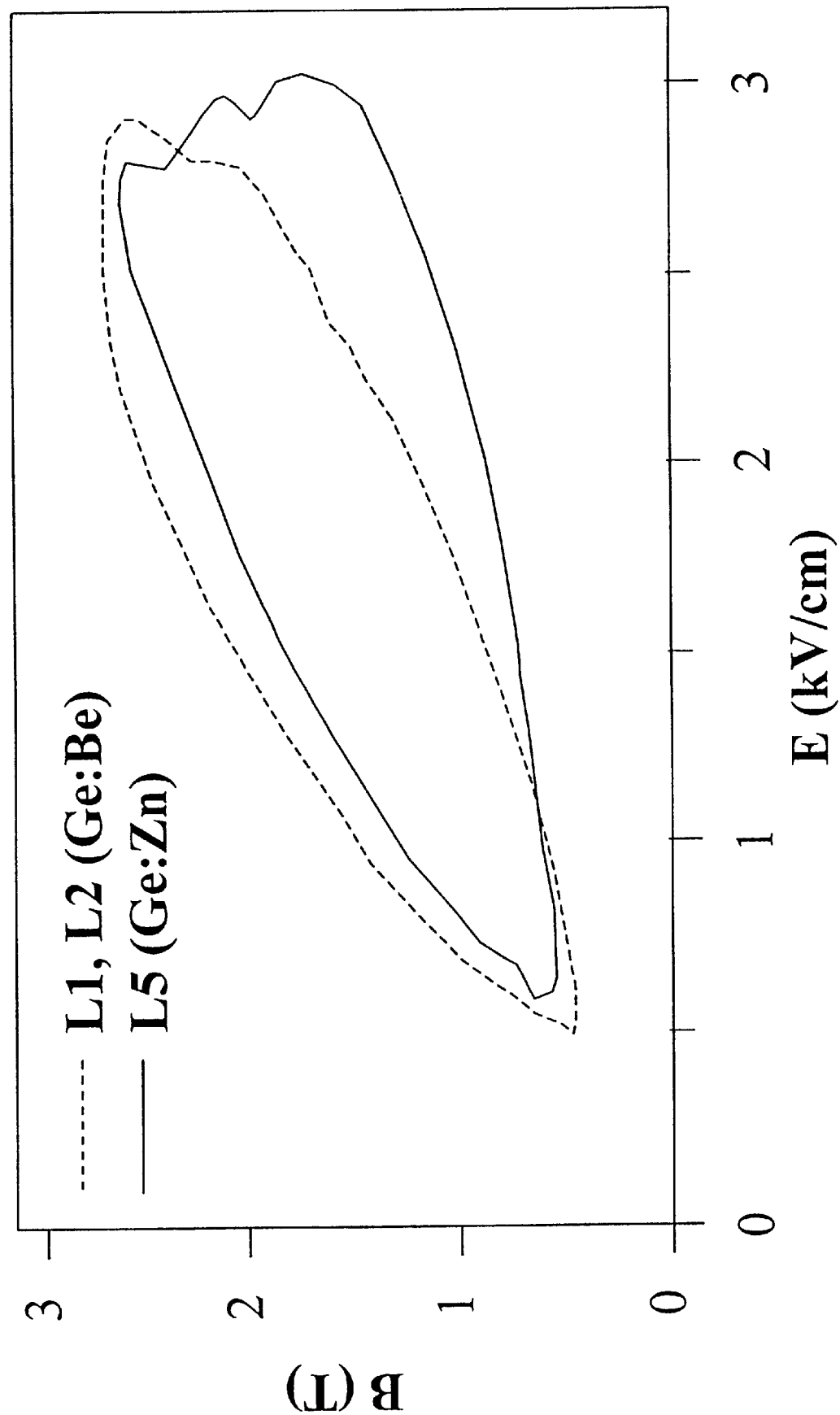
FIG. 1 shows lasing regions of the crystals L1, L2 and L5 given as a function of applied fields E and B.

As used herein:

"Shallow acceptors" means hydrogenic acceptors which exhibit internal hole transitions that partially overlap in energy with intervalence band transitions.

"Far infrared range" or "FIR" means the spectral range which includes frequencies in the terahertz (THz) range.

"Intervalence band" or "IVB" refers to transitions between the light and heavy hole bands.

"Carrier" means either a mobile electron or a mobile hole.

"Hot carrier" means a carrier which is created when an electric field is applied to a semiconductor and when the temperature of the carrier which is a function of their average energy, exceeds a material-specific temperature $T_0$. The behavior of semiconductors in such electric fields is largely determined by these hot carriers.

"Streaming" means a condition resulting from dynamic heating of hot carriers. Streaming occurs while the energy remains in the so-called "passive" range, that is the range of energies below the level where optical phonons are emitted.

"Group I acceptor" means any impurity from the 1st group of the table of elements, that is any chemical element, such as copper, gold and silver, classified in group I of the periodical table of elements.

"Group II acceptor" means any impurity from the 2nd group of the table of elements, that is any chemical element, such as beryllium, magnesium, calcium, zinc, cadmium and mercury, classified in group II of the periodical table of elements.

"Group III acceptor" means any impurity from the 3rd group of the table of elements, that is any chemical element, such as boron, aluminum, gallium, indium and thallium, classified in group III of the periodical table of elements.

"Field E" means electric field expressed in kV/cm.

"Field B" means magnetic induction field expressed in Tesla (T).

"Low duty cycle" means a cycle wherein a pulse is less than 0.1% of the time "on" and more than 99.9% of the time "off".

"High duty cycle" means a cycle wherein a pulse is at least 1% of the time "on" but preferably more.

"Terahertz" or "THz" means $10^{12}$ cycles per second.

"Continuous wave" or "continuous mode" means uninterrupted wave for any length of time.

DETAILED DESCRIPTION OF THE INVENTION

The current invention utilizes, for the first time, non-hydrogenic double or triple acceptor dopants for doping of semiconductors. The invention, which provides a new medium for intervalence band lasers, was conceived and developed in response to a continuing need for a laser which would allow generation of lasing throughout the whole 1–4 terahertz spectrum.

The non-hydrogenic acceptor dopants have much larger hole binding energies than hydrogenic dopants which results in the strong reduction of the internal absorption of the generated far-infrared radiation. The preferred dopants are, among others, double acceptor dopants beryllium and zinc and the triple acceptor dopant copper. The intervalence band laser emission from beryllium, zinc or copper doped germanium crystals for the first time was shown to reach a duty cycle of $10^{-2}$ at a repetition rate of 1 kHz. Such a duty cycle is over two orders of magnitude larger than the highest duty cycle reported for p-type germanium lasers doped by previously used dopants, such as gallium.

The current invention therefore concerns non-hydrogenic acceptor dopants for doping semiconductors, a method for doping semiconductors used for fabrication of infrared intraband transition lasers with acceptor dopants having binding energies larger than the energy of the laser photons, and a far infrared laser comprising germanium or silicon crystals doped with double or triple non-hydrogenic acceptor dopants.

Briefly, the invention involves doping of semiconductors, particularly germanium and silicon crystals, with acceptor dopants of group II, particularly with beryllium, zinc or group I such as copper introduced into semiconductor crystals through melt or diffusion. These dopants do not absorb the laser radiation internally, do not lead to nor require extraordinarily high electrical currents and therefore allow uninterrupted emission and lasing. Through their properties, the dopants allow building of smaller more compact lasers with reduced dissipation power resulting in slower self-heating and much longer pulse length of tens of microseconds.

The invention additionally concerns a small compact laser having improved properties comparing to prior art far infrared lasers cooled either by liquid helium or by a closed cycle refrigerator.

I. Semiconductors and Dopants

The invention is useful for preparation of lasers comprising semiconductors, primarily germanium, silicon, silicon carbide, diamond, Group III-V compounds, such as gallium arsenide, gallium phosphide, etc., and Group II-VI compounds, such as zinc selenide, cadmium telluride and their alloys. The semiconductors germanium and silicon are doped with non-hydrogenic acceptor dopants selected from the elements of Group II of the periodic table of elements, preferably beryllium, zinc, cadmium and mercury as well as copper, gold and silver representing elements of the Group I of the periodic table of elements. All combinations of elemental conductors, such as germanium, silicon and diamond, as well as their alloys in any suitable combination, such as silicon carbide, as well as group III-V compounds, such as gallium arsenide, gallium phosphide, and Group II-VI compounds, such as zinc selenide, zinc sulfide, zinc telluride and suitable alloys of these compound semiconductors doped with any appropriate acceptor dopant or a combination thereof, are intended to be within the scope of this invention.

II. Doping of Semiconductors with Non-Hydrogenic and Deep Dopants

The invention primarily concerns and improves properties and performance of lasers which utilize pulsed p-type semiconductors, such as germanium, silicon, silicon carbide or diamond crystals. These semiconductors are doped with non-hydrogenic or deep dopants, such as beryllium, zinc or copper, among others. Specifically, the invention was tested on germanium and silicon crystals doped with beryllium, zinc or copper. Thus doped semiconductors were shown to lase at high duty cycles at a much improved repetition rate, as described in detail below.

A. Improvements of Laser Performance

Doping germanium with beryllium and zinc has led to laser duty cycle improvements of over 100 compared to the standard germanium-doped crystals.

Germanium crystals grown and/or doped according to the invention are the preferred medium for the improved lasers according to the invention. Improved laser comprising alternative crystals, such as silicon crystals, diamond, silicon carbide and others, grown and doped similarly with non-hydrogenic or deep dopants may also give rise to high-duty cycle far infrared range lasing within the range of 1–4 THz for germanium, 1–10 THz for silicon, and higher frequencies for diamond and for silicon carbide.

Improvements additionally comprise any form and action of high quality when external optical elements, such as lenses, mirrors, gratings, apertures, mesh filters, etc., are used. Such cavities make lasing much easier as much of the stimulated radiation is preserved in the system. The resulting optical gain increase is used to further reduce the size of the lasing crystals. This in turn leads to a lower hole current at a lower operating voltage, resulting in less power dissipation and larger laser pulse duration. With this external optical optimization continuous wave operation is possible.

B. Doping of Germanium with Non-Hydrogenic Acceptors

The present invention utilizes a semiconductor doped with non-hydrogenic deep acceptors, such as a p-type germanium semiconductor crystals doped with double acceptors beryllium and zinc or a triple acceptor copper. Because these three acceptors have significantly higher hole binding energies and internal hole transitions above the interband transition energies, they do not absorb the intervalence band (IVB) radiation. As a result, far greater stimulated radiation occurs in the germanium crystals doped with these dopants.

Doped semiconductors according to the invention are typically prepared from Czochralski-grown p-type crystals grown and melt or in-diffusion doped with the suitable dopants.

In the general approach, the doping of the semiconductors with dopants such as beryllium or zinc is by melting, where the dopant is added into the melt and the doped crystal is then grown. The laser crystals are cut from the doped crystal into parallelepipeds, then lapped, for example with a Si-C grit/water slurry, and polish-etched, for example with a $HNO_3$:HF mixture. Ohmic contacts are formed by, for example, implanting an acceptor dopant with doses of about $1 \times 10^{14}$ cm$^{-2}$ and $2 \times 10^{14}$ cm$^{-2}$, at about 33 and 50 keV, respectively. Then metals, such as about 200 Angstroms of Pd and about 4000 Angstroms of Au, are rf-sputtered onto the implanted surfaces. Annealing is performed at about 300° C. in about 1 hour in an $N_2$ or any other suitable ambient to remove implantation damage and to fully activate the dopant acceptors of the implanted layer.

Laser emission is typically measured in the Faraday configuration with crystals immersed in liquid helium in a cryostat, and is detected with a fast, highly compensated photoconductor, such as Ge:Ga photoconductor or with a bolometer, typically operated at 4.2 K. Spectral measurements are typically performed in the range of about 0–500 cm$^{-1}$ with a far-infrared Fourier transform spectrometer.

In an alternative doping, such as in the case of copper doping, the dopant is typically introduced by in-diffusion, performed for example for a period of about 40 hours at a temperature of about 600 to about 700° C. The in diffusion doping is preceded by plating the germanium crystal with copper.

The invention was tested on germanium semiconductors doped with beryllium, zinc or copper. The first time non-hydrogenic acceptor dopants beryllium and zinc were introduced into bulk germanium crystals through melt or diffusion. The detailed procedures for doping germanium crystals and for testing performed during the development of this invention are described in Examples 1–6. In the germanium semiconductors, the use of germanium facilitates lasing because the high refractive index of germanium enables lasing with internal reflection modes, the surfaces forming an internal cavity. Intra-band transition germanium lasers require acceptor doping in order to provide the hole current necessary for laser action.

The specially doped-germanium crystals were tested for their suitability as far-infrared lasers. Results of these studies are described in FIGS. 1–20.

For these studies, several germanium Czochralski-grown p-type crystals were prepared according to Example 1 and doped with beryllium, zinc or a combination of beryllium with phosphorus. The properties of these crystals are shown in Table 1.

TABLE 1

| Ge Crystal | Dopant | $N_A$ ($10^{14}$ cm$^{-3}$) | GC | L (mm) | D (mm) | W (mm) |
|---|---|---|---|---|---|---|
| L1 | Be | 4.2 | vac | 5.1 | 7.6 | 5.1 |
| L2 | Be | 4.2 | vac | 2.1 | 5.9 | 3.3 |
| L3 | Be, P | 7.0 | vac | 2.0 | 6.0 | 3.0 |
| L4 | Be | 0.8 | $D_2$ | 25.0 | 3.1 | 3.0 |
| L5 | Zn | 2.0 | vac | 3.0 | 5.3 | 3.0 |

Table 1 shows properties of germanium crystals L1–L5 doped with different dopants, such as beryllium (L1, L2 and L4), zinc and beryllium-phosphorus combination (L3), at different doping concentrations $N_A$, between 0.8 to $7.0 \times 10^{14}$ cm$^{-3}$ under growing conditions (GC) in either vacuum or deuterium gas, for length of lasing direction from 2.0 to 25.0 mm, distance between electrical contacts between 3.1 and 7.6 and width between 3.0 and 5.1.

The intervalence band emission was measured in the Faraday configuration by immersing the crystals into liquid helium at 4.2 K and applying electric and magnetic fields.

When the electric field is applied to a semiconductor, carriers, which are either electrons or holes, are accelerated and can become hot. The behavior of the semiconductor in an electric field is determined by these hot carriers. When the energies of the carriers reach the active range, optical phonons are emitted. Germanium has two types of holes, light and heavy holes which behave as two types of carriers. When, in addition to the electric field, the magnetic field is applied, a population inversion of the hole carrier distribution occurs resulting in light emission due to transition of holes from light hole to heavy hole band.

The criteria for initiating such inversion may be determined quantitatively. Since the energy is proportional to mass, the light hole maximum energies are lower than those of the heavy holes and lead to hole subband inversion. Inversion is dependent upon the optical phonon energy of the semiconductor. The optical phonon energy of germanium is 37 meV. That means that heavy holes scatter into the light hole band with optical phonon emission (EH≧37 meV in germanium), while light holes cannot emit optical phonons (EL<37 meV) for a range of drift velocities E/B, which for germanium is less than 2.75 kV/(cmT).

Heavy hole scattering into the light hole band is dependent upon the relative concentrations of holes. When the drift velocity is smaller than a predetermined value, i.e. 0.96 kV/(cmT) in germanium, the heavy holes cannot reach optical phonon energy, and scattering of heavy holes into the light hole band does not occur. Thus, the inversion only occurs within a predetermined range of drift velocities.

The results of testing of the present invention, described in detail below, indicate that when germanium is doped with dopants of the invention, these dopants change the properties of the germanium crystal and lasing occurs at energies below the optical phonon energy.

Figure 2:
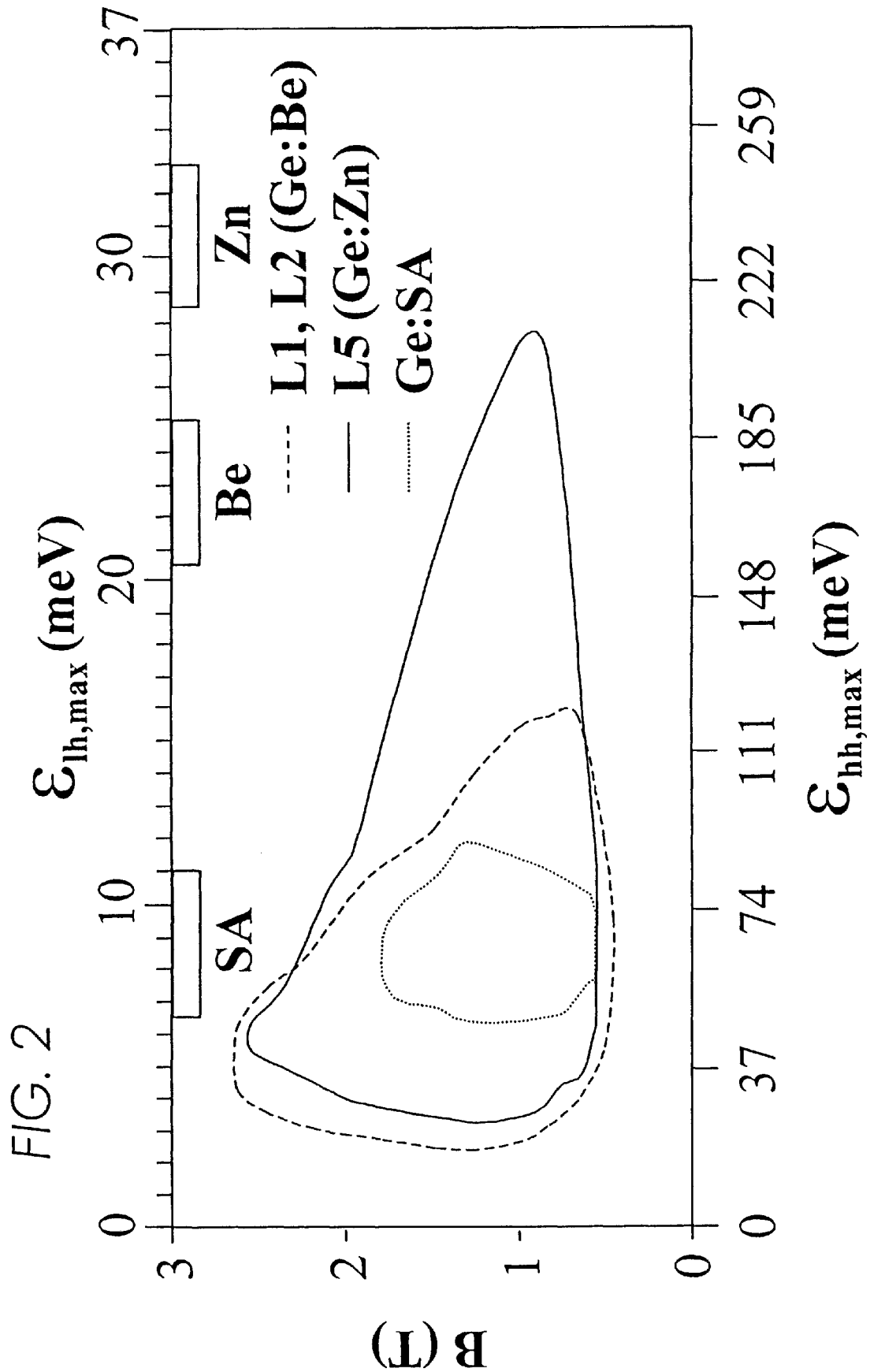
FIG. 2 shows lasing regions from FIG. 1 recalculated with respect to the maximum heavy (E$\lambda$h, max) and light hole energies (Elh, max).

Lasing regions of the crystals L1, L2 and L5 given as a function of the applied electric E field and magnetic induction field B are seen in FIG. 1. FIG. 2 shows the lasing regions from FIG. 1, replotted as a function of the maximum hole energies for ease of interpretation.

FIG. 1 shows the lasing regions of the doped germanium crystals L1, L2, and L5 as a function of the electric field E and magnetic field B. FIG. 2 shows lasing regions from FIG. 1 recalculated with respect to the maximum heavy ($E_{hh,max}$) and light hole energies ($E_{lh,max}$) The FIG. 2 shows the lasing regions for both the shallow acceptors (SA) and L1–L5 crystals doped with group II acceptors. The filled boxes along the $E_{lh,max}$ axis indicate the energy ranges which coincide with bound-state hole transitions of shallow acceptors (SA) and the double acceptors beryllium and zinc.

As seen in FIG. 2, Group II acceptor (L1–L5) absorption lines have significantly higher energies and lasing is observed at the first resonance between the optical phonon and the maximum heavy-hole energy. The emission increases when the heavy hole energy is in resonance with multiples of 37 meV, the optical phonon energy at the center of the Brillouin zone of germanium. The population inversion forms if the light holes cannot emit optical phonons while heavy holes do and scatter into the light hole band. Therefore, the maximum light-hole energy must remain below 37 meV to contribute to the inversion.

The internal absorption of the radiation from light-to-heavy-hole transitions by neutral shallow acceptors of the prior art is strongest near 9.0, 8.3, and 6.6 meV. The maximum emission in germanium doped with shallow acceptors is not found at 37 meV but at higher resonances, e.g., close to the second heavy hole resonance at 80 meV for which the light-hole energy is 106.7 meV. This value corresponds to an E/B ratio of 1.4 kV/cmT leading to optimum laser action in germanium:gallium crystals.

FIG. 3 shows laser pulse intensity of the crystal L1 as a function of the electric field E at a magnetic field.

FIG. 3 A shows an electric field sweep at a constant magnetic field B equal to 1.2 T (FIG. 3 A). The maximum intensity was found at a drift velocity (E/B) equal to 1.0 kV/cm T. As observed in FIG. 2, the laser signal has been found at energies above 20 meV. This value coincides with the energy of the smallest, optically active, ground- to bound-excited-state transition of beryllium, indicating that the heavy holes scatter resonantly with bound states.

In addition to producing additional free carriers, such scattering events change the momentum of the heavy holes which can scatter with an optical phonon in the next oscillation around the drift center and build a hole population inversion. Therefore, emission is found even below 37 meV. The lasing region of the germanium:zinc laser begins above 28 meV due to the larger chemical shift of the ground state of zinc acceptors, seen in FIG. 2.

FIG. 3 B shows lasing regions of crystals L2 (open region) and L3 (filled region) as a function of maximum heavy-hole energy (hhe) given in units of the optical phonon energy.

In FIG. 3 B, the lasing regions of L2 and L3 are compared. The higher doping level of L3 decreases the region in the direction of higher resonances. The laser action observed with L3 proves that the residual group III acceptors are not necessary for impact ionization of the deeper beryllium acceptors indicating that they can be ionized directly by the applied electric field.

FIG. 3 C shows lasing regions of crystal L4 measured at a repetition rate of 1 and 500 Hz (filled area) with an applied electric pulse length of 750 ns.

FIG. 3 C shows the lasing regions of the largest crystal L4, heat sunk on one full area contact to a copper sample holder, measured at repetition rates of 1–500 Hz. The region at 1 Hz is larger than that of L2. Increasing the repetition rate raises the mean temperature of the crystal lattice, and the region shrinks to the highest gain region due to increased losses from acoustic phonon scattering. At the maximum repetition rate of 1 kHz, a single point at B equal to 0.84 T and 37 meV remains. For a constant electric and magnetic field (E=0.97 kV/cm, B=0.84 T), the signal intensity rises from an initial value measured at 5 Hz to the detector saturation value at 60 Hz. Acoustic phonons assist in the ionization of the deeper group II acceptors so that higher crystal temperatures are more favorable for laser action. At 310 Hz the signal drops sharply below the detector saturation.

The delay between the exciting electric pulse and the rise of the laser pulse is close to the electric pulse length, and the laser signal can no longer reach the laser saturation value. This leads to a decrease in laser signal which vanishes completely at 1 kHz.

For L5, a threshold current of 1.2 Å was measured at the minimum electric field required for laser action and at a power consumption of 0.4 kW. The low power density leads to slow heating resulting in a laser pulse length of 25 $\mu$s, over twice the pulse length obtained with low doped germanium:gallium lasers.

Spectral measurements show that the emission spectrum from 1 to 4 THz or to even higher frequencies is fully covered and that the frequency gaps which are found with group III lasers vanish due to the deeper acceptor levels, e.g., the first absorption line of beryllium is found at 5 THz.

Laser action in germanium crystals doped with group II acceptors was found to possess an optimum emission at a drift value of E/B=10 kV/cm T. Measurement of six laser crystals which differ in doping concentration, acceptor species, and geometry detected the longest laser pulse of 25 $\mu$s for a germanium:zinc laser and a fivefold reduction in power consumption. The duty cycle was improved to $10^{-3}$ by using a beryllium-doped germanium crystal.

Results obtained in studies in this section clearly show that germanium crystals doped with group II acceptor dopants beryllium or zinc enable continuous or long pulse lasing. The lasing is much improved against shallow acceptors used previously which allowed only a $10^{-5}$ duty cycle. The group II acceptors improved the pulsation to a $10^{-2}$ cm duty cycle.

Results obtained with germanium lasers doped with acceptors with larger hole binding energies show that these dopants are also suitable for alternative laser crystals, such as p-type silicon lasers. Boron acceptors in silicon have a hole binding energy of 45.7 meV, which is very close to the zinc or copper acceptor binding energies in germanium.

II. Emission from Beryllium and Zinc Doped Germanium

To determine properties of the germanium crystals doped with dopants of the invention, the spectrum of stimulated far-infrared emission from beryllium and zinc-doped germanium single crystals in crossed electric and magnetic fields was measured.

The investigated spectrum consisted of broad radiation bands in the frequency range of 40 to 130 $cm^{-1}$ which are due to intervalence band transitions and new narrow emission bands with their center frequencies rising linearly with magnetic field. The latter emission was demonstrated to be due to cyclotron resonance hole transitions between Landau levels of the light-hole subband accompanied by a simultaneous spin-flip, combined resonances.

In these studies, spectral measurements of the stimulated emission from germanium crystals doped with the double acceptors beryllium and zinc were made. Neutral beryllium and zinc have ionization energies of 25 and 33 meV, respectively, and therefore do not lead to self-absorption in the emission range. In the extension of the studies described above which demonstrated laser action from germanium crystals doped with the double acceptors beryllium and zinc and the triple acceptor copper described below, unambiguous spectral investigations have led to the discovery of stimulated emission from combined cyclotron resonances. Combined cyclotron resonances were described previously in *Phys. Rev. Lett.,* 21:983 (1968).

For this study, samples from two Czochralski-grown single crystals, one doped with beryllium and the other with zinc were used according to Example 3. Lasers were produced from wafers as described in section V. The wafers were characterized by variable temperature Hall-effect measurements and photothermal ionization spectroscopy.

Results of these studies are seen in FIGS. 4–7.

Figure 4:
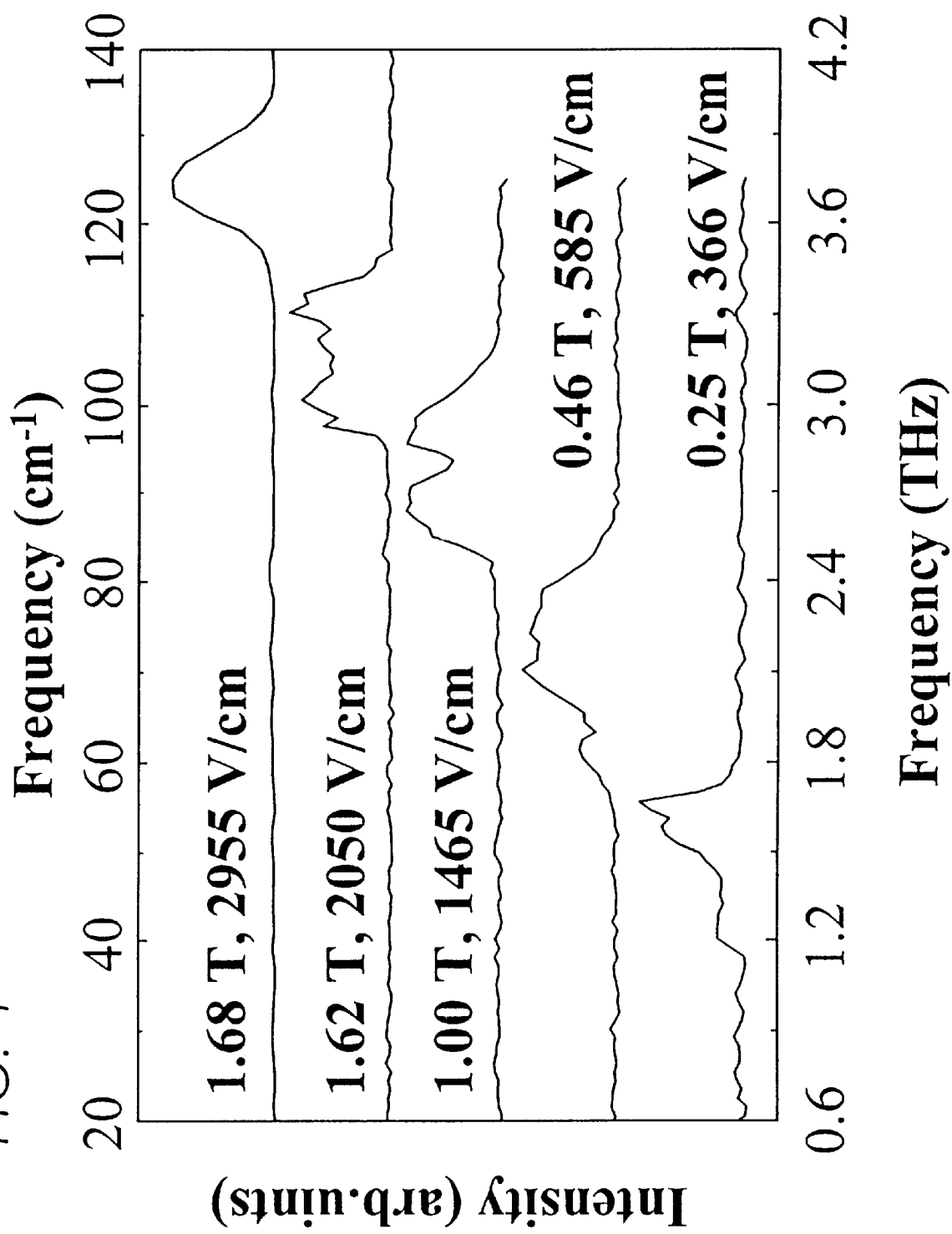
FIG. 4 shows stimulated emission spectra for various combinations of electric (E) and magnetic (B) fields.

FIG. 4 shows stimulated emission spectra for various combinations of E and B fields. In this figure, the spectral resolution was 1 cm$^{-1}$ except for the spectrum measured at 1.68 T which has a resolution of 2 cm$^{-1}$.

Specifically, FIG. 4 shows the emission spectra of a 4×4×20 mm$^3$ germanium:beryllium laser for different combinations of E- and B fields. The magnetic field was oriented parallel to the long axis of the crystal which pointed along a (110) crystallographic direction. The electric field was applied perpendicular to B and parallel to a (001) direction. As seen in FIG. 4, by varying both fields intravalence band stimulated emission was achieved throughout the range of frequency 40 to 130 cm$^{-1}$. These findings confirm that the semiconductors doped with non-hydrogenic dopants of the invention provide continuous wave emission over the frequency range 40–130cm$^{-1}$. This represents definite and significant improvement when compared to gallium-doped germanium lasers which exhibit an emission gap between 60 and 80 cm$^{-1}$.

Figure 5:
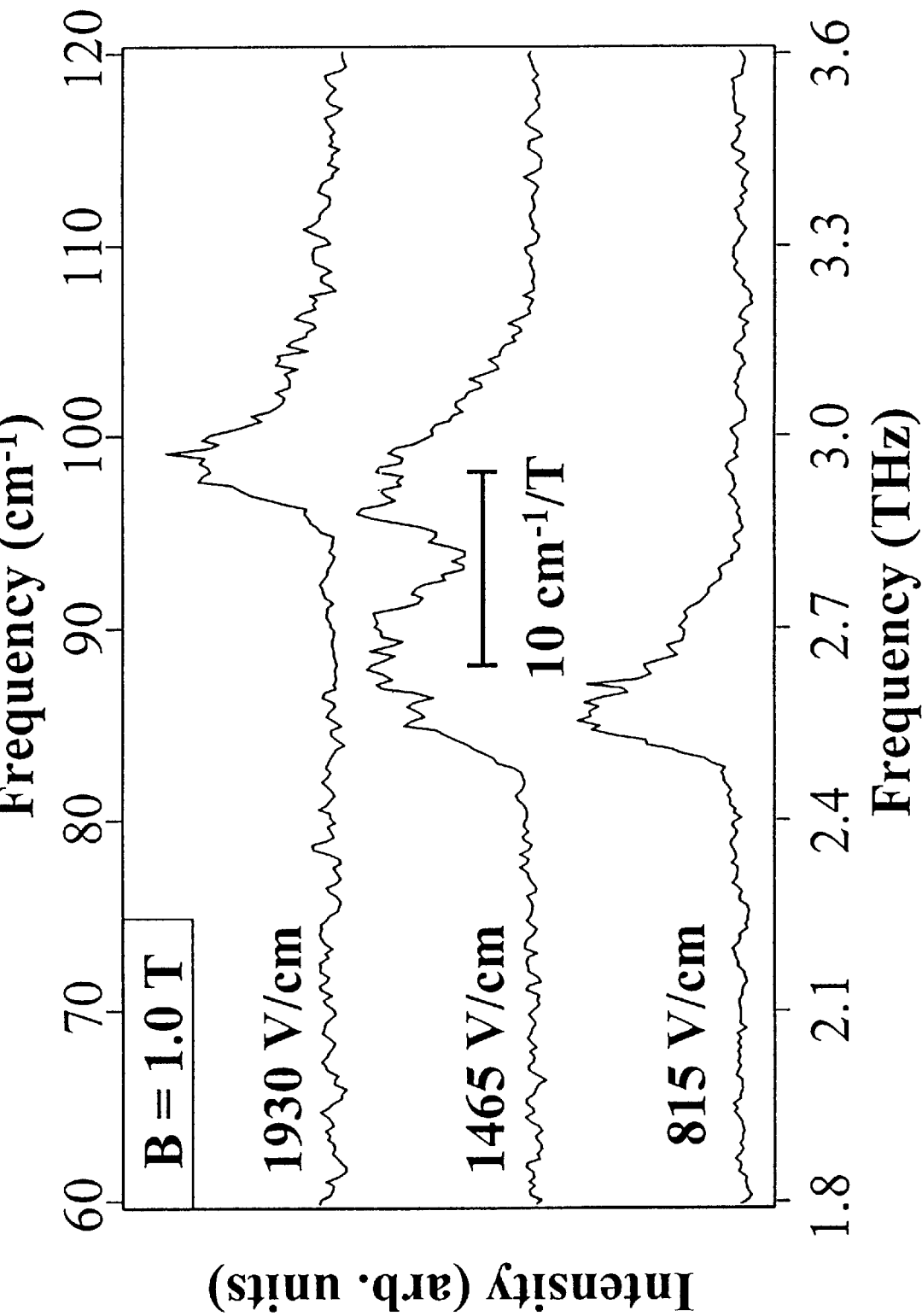
FIG. 5 shows stimulated emission spectra where magnetic field B equals 1 Tesla as a function of electric field.

FIG. 5 shows stimulated emission spectra at B=1 T as a function of electric field at a resolution 0.25 cm$^{-1}$.

Specifically, FIG. 5 shows the electrical E field dependence of the emission at a magnetic induction field B=1 T. Two emission bands are observed. These bands shift very weakly with E, but the intensity of the higher frequency band increases with higher field (1465 V/cm) (1930 V/cm) at the cost of its lower frequency counterpart which is more prominent at 815 V/cm. Internal absorption by neutral impurities has been excluded as the cause for the signal minimum between the two bands since strong emission at this frequency can be generated at B=1.16 T and E 1.46 kV/cm.

Figure 6:
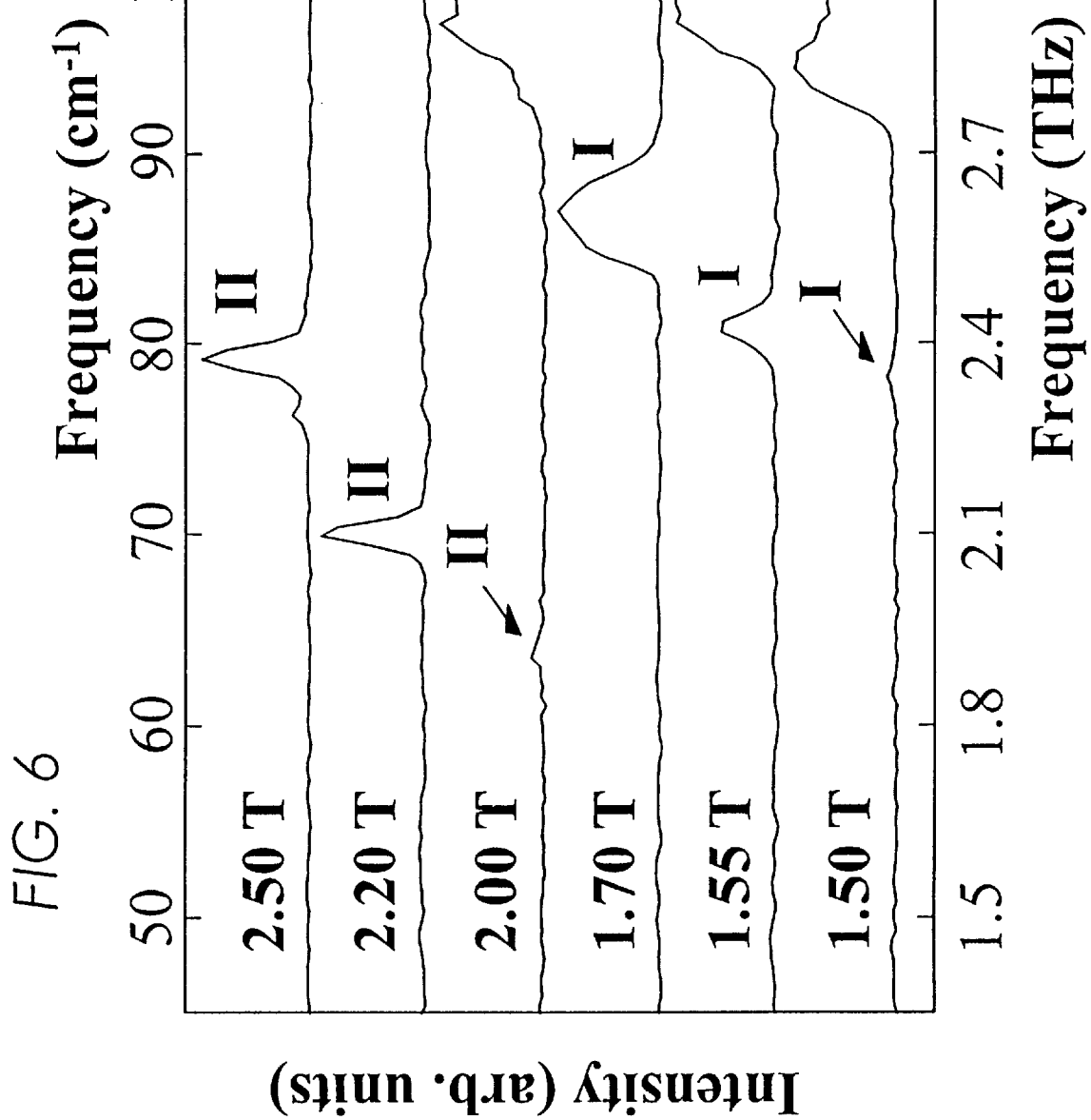
FIG. 6 shows stimulated emission spectra as a function of magnetic field.

Additional spectral investigations were made and are seen in FIG. 6. These investigations were made at E/B=1 kV/cmT while tuning B up to 3 T.

FIG. 6 shows stimulated emission spectra as a function of magnetic field at a resolution 0.5 cm$^{-1}$. The ratio E/B is equal to 1.0 kV/cmT for all spectra. The broadband emission at the lower magnetic (B) fields (1.5–1.7 T) is due to intervalence band transitions which is similar to the spectra seen in FIGS. 4 and 5. For B higher than 1.5 T a new emission line of relatively small width, labeled I in FIG. 6, appears at 78 cm$^{-1}$. A slight change in the magnetic field from 1.5 to 1.55 T resulted in a shift of the line position to higher energy and in a drastic increase of the line intensity. Upon further increasing the magnetic field, the frequency of the line I increased linearly with B and the line I also broadened significantly. At B=2 T this emission has achieved a broadband character and yet another line structure, labeled II in FIG. 6, appeared at 63 cm$^{-1}$. The frequency positions of lines I and II are shown in FIG. 7.

Figure 7:
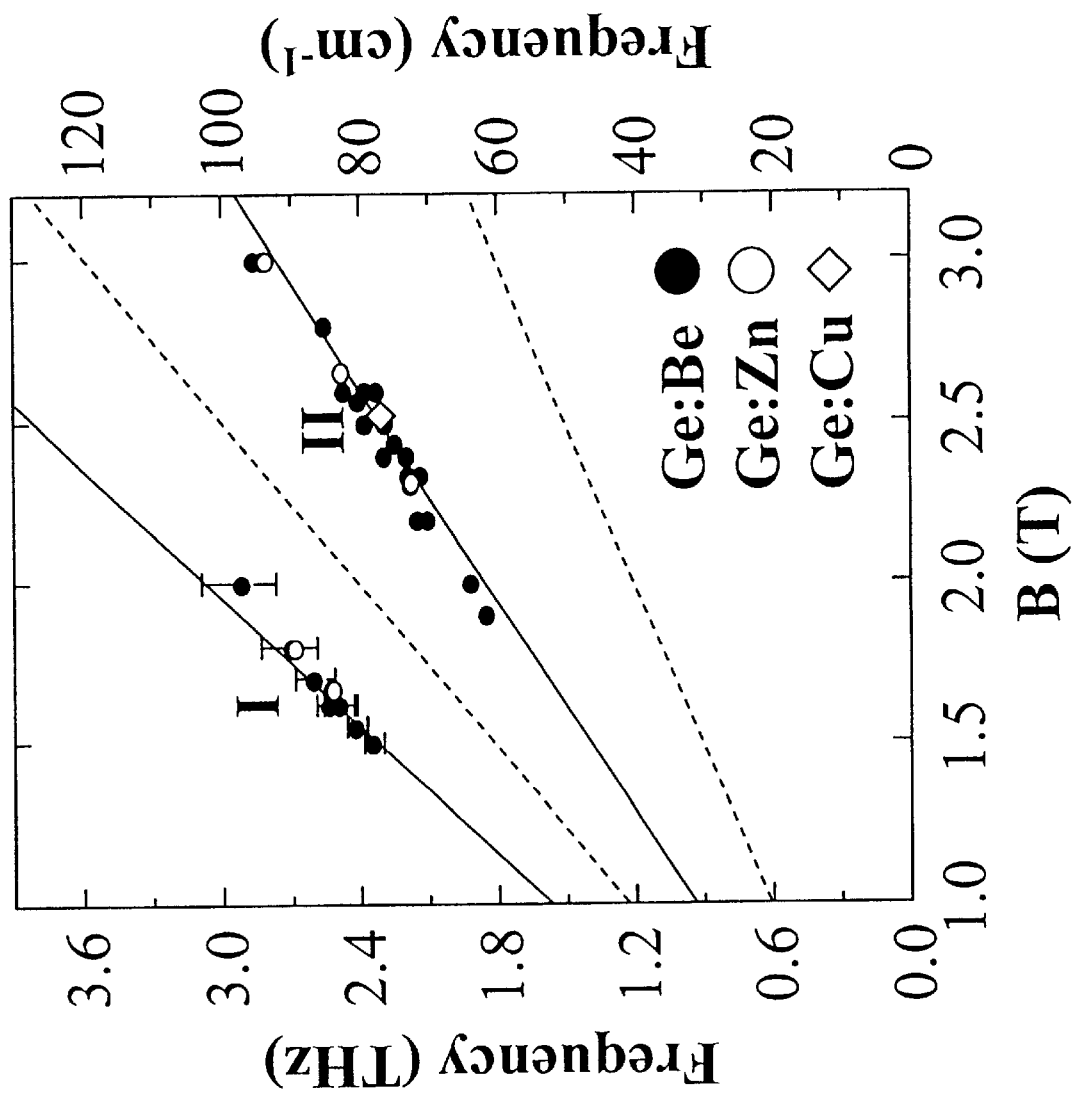
FIG. 7 shows frequency dependence of emission I and II from beryllium, zinc- and copper-doped germanium laser crystals with magnetic field.

FIG. 7 illustrates the frequency dependencies of emission I and II on magnetic field. The full circles (-●-), empty circles (-○-), and empty diamonds (-◇-) represent emission from beryllium, zinc and copper-doped germanium laser crystals, respectively. The lines represent the calculated frequencies for the transitions $b_1 \rightarrow b_0, \rightarrow b_1 \rightarrow a_0, \rightarrow b_2 \rightarrow a_0$ (from bottom to top). The dashed lines do not involve a spin-flip while the solid ones do.

As seen in FIG. 7, changing the crystallographic orientation of the outcoupling, and therefore also the magnetic field orientation, from (110) to (100) suppresses the narrow band emission I and II. Such behavior of the stimulated emission has not been observed for shallow acceptor doped germanium crystals because of the dopant self-absorption. These results clearly show that the dopants have improved properties particularly with regard to self-absorption which does not occur.

Laser crystals doped with the zinc double acceptor show both the broadband emission that is B field tunable up to 130 cm$^{-1}$ and the double band structure observed at 1 T. In addition, as seen in FIG. 7, the low frequency lines I and II occur at the same position. Samples doped with the copper triple acceptor exhibited similar spectral characteristics as those shown in FIG. 6. The spectral nature of the observed emission seems, therefore, related to the intrinsic properties of the germanium valence band and not to the dopant species.

This study confirmed that self-absorption in double acceptor doped germanium is missing and that semiconductors doped with non-hydrogenic dopants have improved emission due to decreased or eliminated self absorption of the dopants.

III. Emission from Copper-Doped Germanium

To further investigate dopants for improved laser performance according to the invention, the triple acceptor copper was used for doping germanium crystals. Copper-doped germanium which is easily prepared by diffusion was found to have an ionization energy of 43.2 meV and therefore does not contribute to the internal absorption of the laser radiation observed with shallow acceptors. High ionization energy indicates improved laser action.

In copper-doped germanium crystals, substitutional copper is a triple acceptor having a hole binding energy of 43 meV in its neutral state. Hole transitions from the ground state to bound excited states of the copper impurities take place at energies well above intervalence band laser emission. Results of performed studies provide the first clear evidence of intervalence-band laser emission from germanium:copper crystals along with measurements of the emission spectra.

The experimental set-up for investigation of copper-doped germanium was according to Example 4. Briefly, germanium wafers were cut from a Czochralski-grown, P-type germanium ingot and processed as described in Example 4. The wafers were crystallographically oriented and cut to sample geometries with dimensions larger than the final laser device.

Exemplary samples of investigated germanium crystal dopants are listed in Table 2.

TABLE 2

| Sample | Dopant | $N_M$ ($10^{14}$ cm$^{-3}$) | $N_{SA}$ ($10^{12}$ cm$^{-3}$) | GC | CO | Dimensions D × L × W (mm$^3$) | Diffusion temperature (° C.) | E-field direction | $P^{th}$ ($10^{13}$ cm$^{-3}$) | $P_{max}$ ($10^{13}$ cm$^{-3}$) |
|---|---|---|---|---|---|---|---|---|---|---|
| Cu14 | Cu | 1.5 | 3 | Hydrogen | (110) | 4.8 × 45.3 × 6.7 | 600 | <110> | 0.5 | 3 |
| Cu15 | Cu | 15 | 3 | Hydrogen | (110) | 4.5 × 39.2 × 6.0 | 700 | <110> | 1.4 | 8 |
| Be14 | Be | 1.4 | 1 | Vacuum | (110) | 4.1 × 19.4 × 2.2 | *** | <110> | 3 | 14 |

Table 2 show the characteristics of the studied lasers Cu14, Cu15 and Be15. Dopants used were either copper or beryllium; dopant concentration ($N_M$) ranged from 1.4 to 15 times $10^{14}$ cm$^{-3}$; residual shallow acceptor concentration ($N_{SA}$) was from 1 to 3 times $10^{12}$ cm$^{-3}$; crystal growth (gallium) was performed either under vacuum or under a hydrogen atmosphere; the crystallographic orientation (CO) in the outcoupling direction was (110); laser dimensions were D×L×W, where D is distance between electrodes, L is length of laser in the outcoupling direction and W is width; the diffusion temperature was between 600 and 700° C.; and electrical field (E) orientation was in (110) direction. The concentration threshold ($p_{th}$) or maximum concentration ($p_{max}$) were the threshold and maximum concentrations of free carriers determined from the current value at the onset of lasing action.

Both studied copper-doped germanium lasers Cu14 and Cu15 exhibited a maximum pulse length of 15–16 μs at low repetition rates and a duty cycle of $10^{-3}$ at repetition rates as high as 100 Hz. Results show that for a given crystal and cooling environment, the maximum attainable value for the product of the laser pulse length and repetition rate, i.e., the maximum duty cycle was close to constant. These values compared favorably with the best performances reported for p-type germanium lasers.

Figure 8:
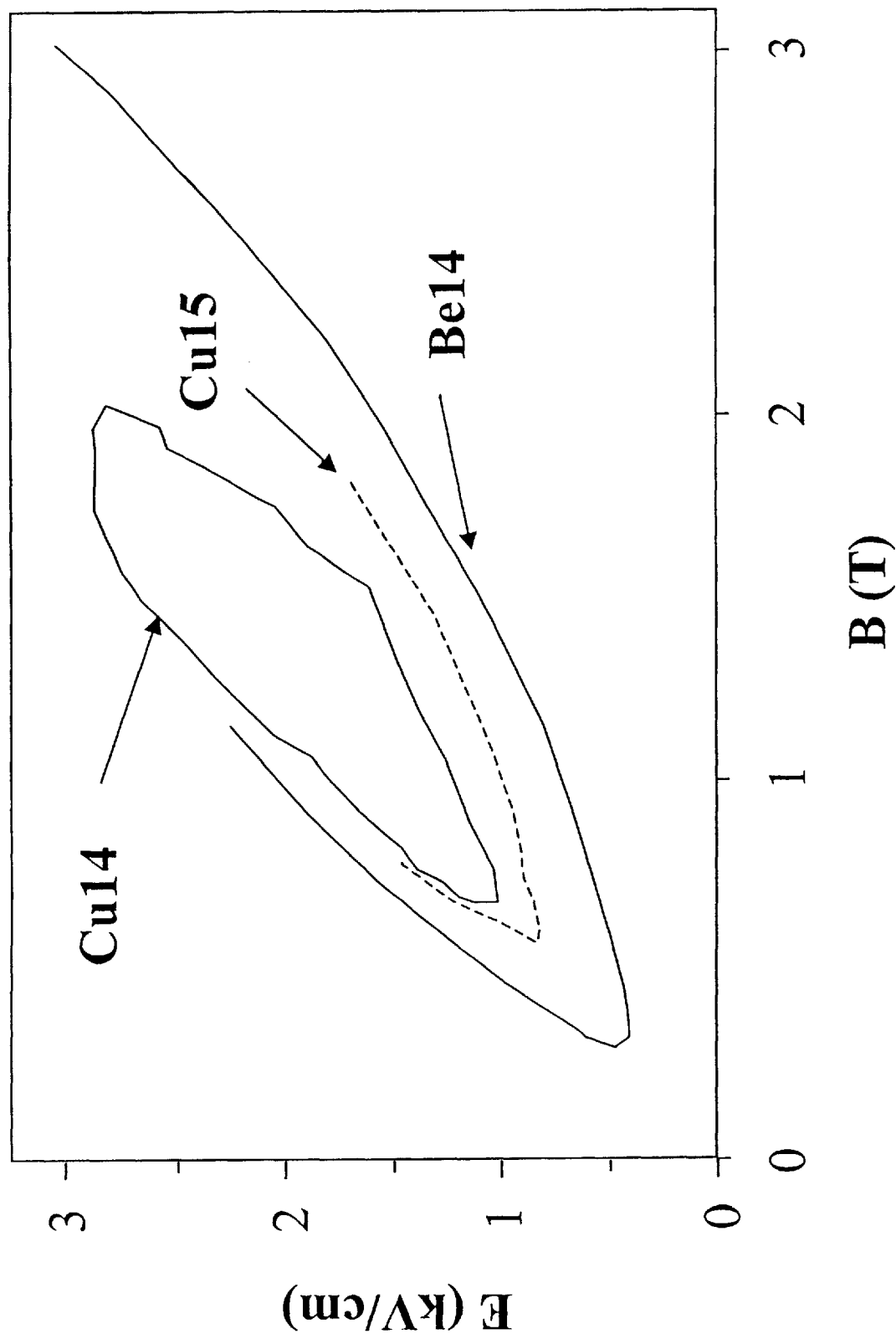
FIG. 8 shows regions of stimulated emission for lasers Cu14, Cu15 and Be 14.

The relationship between the E and B fields for stimulated emission observed for the beryllium or copper-doped germanium lasers is shown in FIG. 8.

FIG. 8 shows regions of stimulated emission for lasers Cu14, Cu15 and Be14, having characteristics seen in Table 2, at a repetition rate of 10 Hz and a fixed pulse length between 1–5 μs, depending on the laser, observed with a fast germanium:gallium photoconductor. The regions of stimulated emission for laser Cu15 and Be14 were not closed at high E and B fields due to the limitations of the power supply.

In FIG. 8, lasing occurs for all sets of values of electric (E) and magnetic (B) fields within the enclosed zone (E,B zone). Copper-doped germanium lasers, as shown in FIG. 8, depend on the doping concentration. The E,B lasing zone shrunk when the copper concentration was lowered from 15 (Cu15) to 1.5×$10^{14}$ cm$^{-3}$ (Cu14). As seen in FIG. 8, the E,B zone of Be14 was much bigger than those of Cu14 which had the same dopant concentration and of Cu15 which had a doping level one order of magnitude higher. The current observation of lasing from crystals with a copper concentration of 1.5×$10^{15}$ cm$^{-3}$ (Cu14) indicate that only a small fraction of the copper acceptors is ionized.

The concentration of ionized copper acceptors was calculated according to *Phys. Rev., B* 20:5192 (1979).

The above described method has been successfully used to estimate the acceptor concentration for germanium lasers doped with single or double acceptors assuming the acceptor concentration is equal to $p_{max}$. For laser Be14 $p_{max}$ is equal to the concentration of beryllium acceptors.

In the cases of Cu14 and Cu15, $P_{max}$ constituted only 20% and 7%, respectively, of the total copper acceptor concentration. This shows that only a small fraction of the copper acceptors is ionized during lasing. The incomplete ionization of copper acceptors is due to the localized nature of the copper impurity potential which is reflected by the significantly higher E field necessary to impact ionize copper acceptors compared to shallow acceptors. This effect is even more pronounced in the presence of strong magnetic fields.

Figure 9:
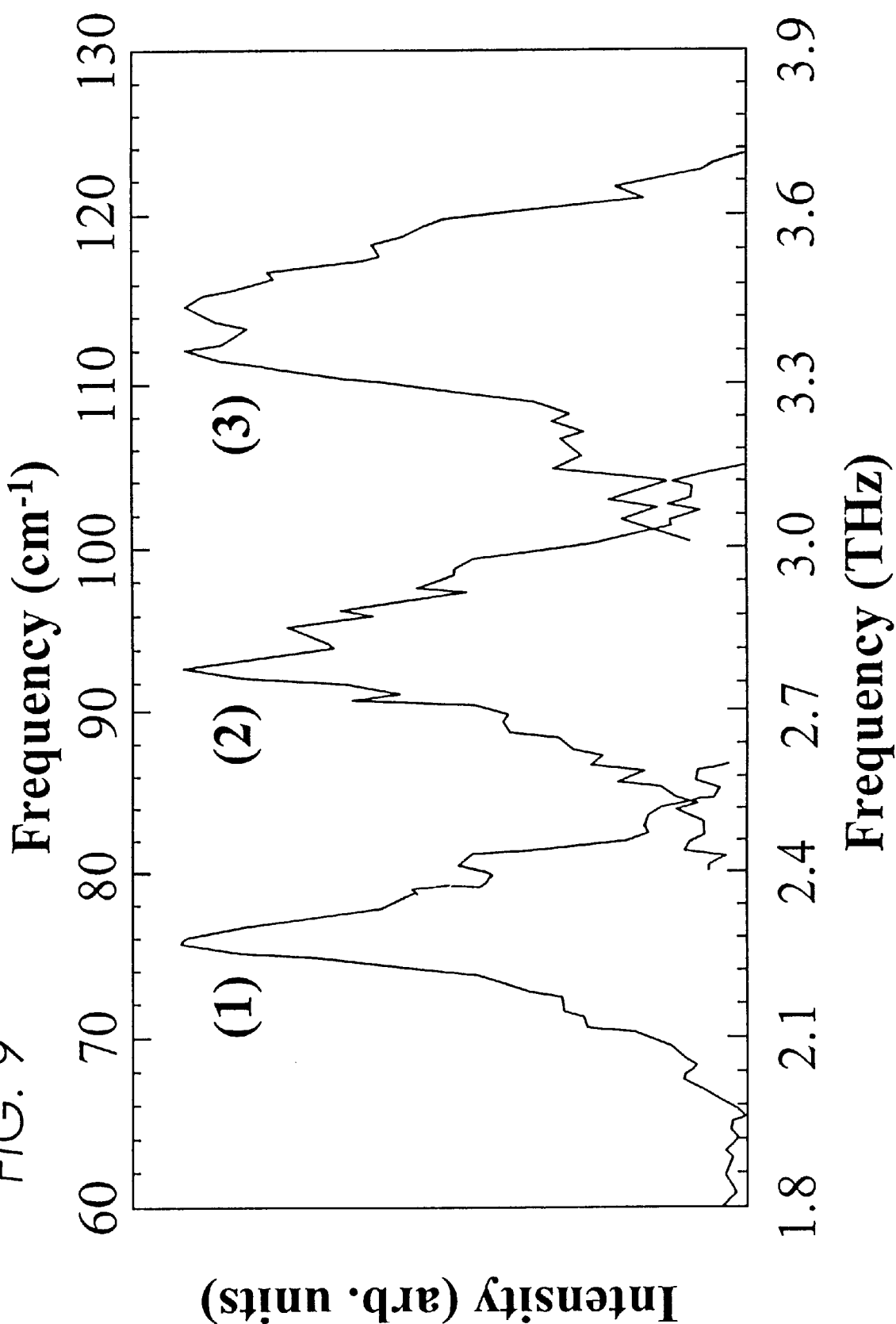
FIG. 9 shows stimulated emission spectra of laser Cu15 as measured with a bolometer.

Emission spectra for different E and B fields for laser Cu15 are shown in FIG. 9.

FIG. 9 shows stimulated emission spectra of laser Cu15 as measured with a bolometer. The E field pulse was 1 μs long and the repetition rate was 10 Hz. The values of the E (kV/cm) and B(T) fields are (1) 1, 0.7; (2) 1.5, 1.0; and (3) 2.3, 1.9, respectively. When tuning the magnetic field between 0.6 and 2.3 T, these measurements show stimulated emission in a spectral range of 70–120 cm$^{-1}$. No significant internal absorption in the 70–80 cm$^{-1}$ range for copper-doped germanium was observed.

The described findings show stimulated emission from copper-doped germanium crystals. Duty cycles as high as $10^{-3}$ were reached with copper concentrations ranging between $10^{14}$ cm$^{-3}$ and $10^{15}$ cm$^{-3}$ without extensive optimization of the materials parameters. The free carrier concentration was shown to be significantly smaller than the copper acceptor concentration, allowing for laser action at higher acceptor concentrations than previously observed and predicted.

Spectral measurements described for these lasers constitute the first documented emission spectra for lasers doped with multivalent acceptors. Stimulated emission over the full 70–120 cm$^{-1}$ range shows that there is no significant internal absorption by these acceptor dopants.

Copper doping is easily achieved in germanium crystals by diffusion additionally making germanium:copper an ideal materials system for investigating the role of materials properties on the streaming motion of carriers and the emission mechanisms of hot-hole lasers.

In the above-described studies, stimulated far-infrared emission from copper-doped germanium single crystals was investigated and detected. Emission in the range of 70–120 cm$^{-1}$ was achieved by varying the magnetic field between 1 and 2.3 T. Laser action was observed for crystals with a copper acceptor concentration as high as 1.5×$10^{15}$ cm$^{-3}$. Such a doping level is considerably higher than that of any previously known single or double acceptor doped germanium laser. Stimulated emission from germanium crystals with such a high copper concentration is possible because only a small fraction of the copper acceptors is ionized during operation.

Copper dopants have been shown to possess properties which greatly improve laser action and function in the far infrared spectral range.

IV. Terahertz Emission from p-Type Germanium Lasers Doped with Acceptors

Existing far infrared Ge lasers are not able to cover the whole far infrared spectrum from 1 to 4 THz and they, therefore, have only a limited utility. Until now available dopants were the shallow hydrogenic dopants which lead to self-absorption and therefore operate only in the low frequency between 1.0 and 1.8 terahertz and the high frequency range between 2.4 and 4.0 terahertz. Consequently, because the spectral region between 1.8 and 2.4 is not covered, the new laser materials are needed to provide continuous wave covering the whole spectrum.

As evidenced from the above studies, the dopants of the invention have properties which greatly improve the laser function and extend the emission across the spectral regions previously not covered. Studies described in this and in the above sections show that the new non-hydrogenic dopants greatly broaden the far infrared spectrum and provide close to the continuous wave across the whole infrared spectrum.

For this purpose, the stimulated emission from germanium single crystals doped with the multivalent acceptors beryllium, zinc, and copper was further investigated. Unlike those lasers containing shallow acceptors, lasers doped with the double acceptors beryllium and zinc exhibit stimulated emission over the full range of 1 to 4 THz. The results of germanium doped with the copper triple acceptor show that emission between 1.5 and 4 THz can also be achieved.

By using semiconductors doped according to the invention, the high duty cycle was increased up to the $10^{-2}$ range which is one order of magnitude higher than the maximum duty cycle reported for shallow acceptor doped lasers.

This section describes the results of spectral measurements of the stimulated emission from beryllium, zinc and copper-doped germanium crystals.

Figure 10:
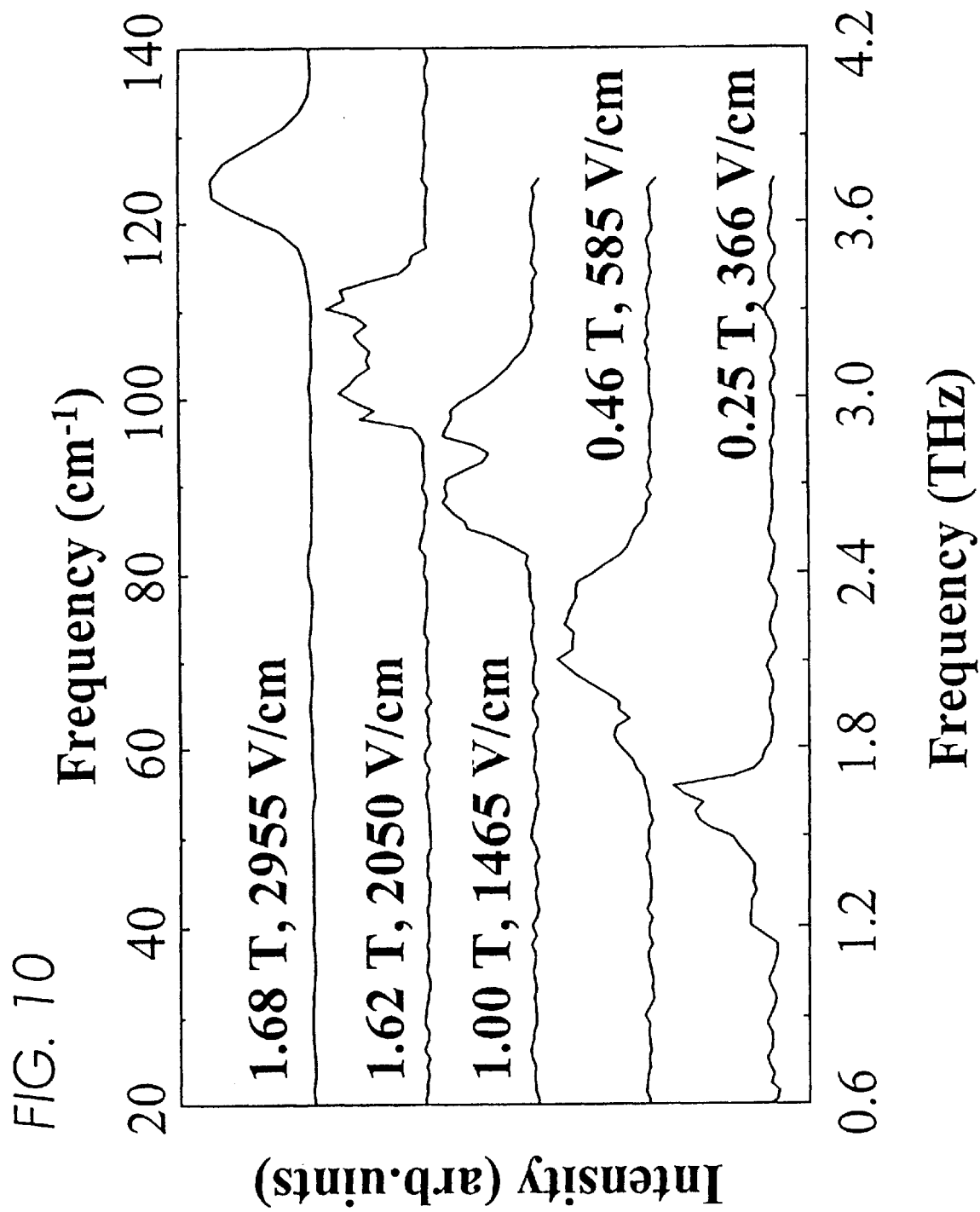
FIG. 10 shows stimulated emission spectra from a Ge:Be laser for various combinations of electric (E) and magnetic (B) fields.
Figure 11:
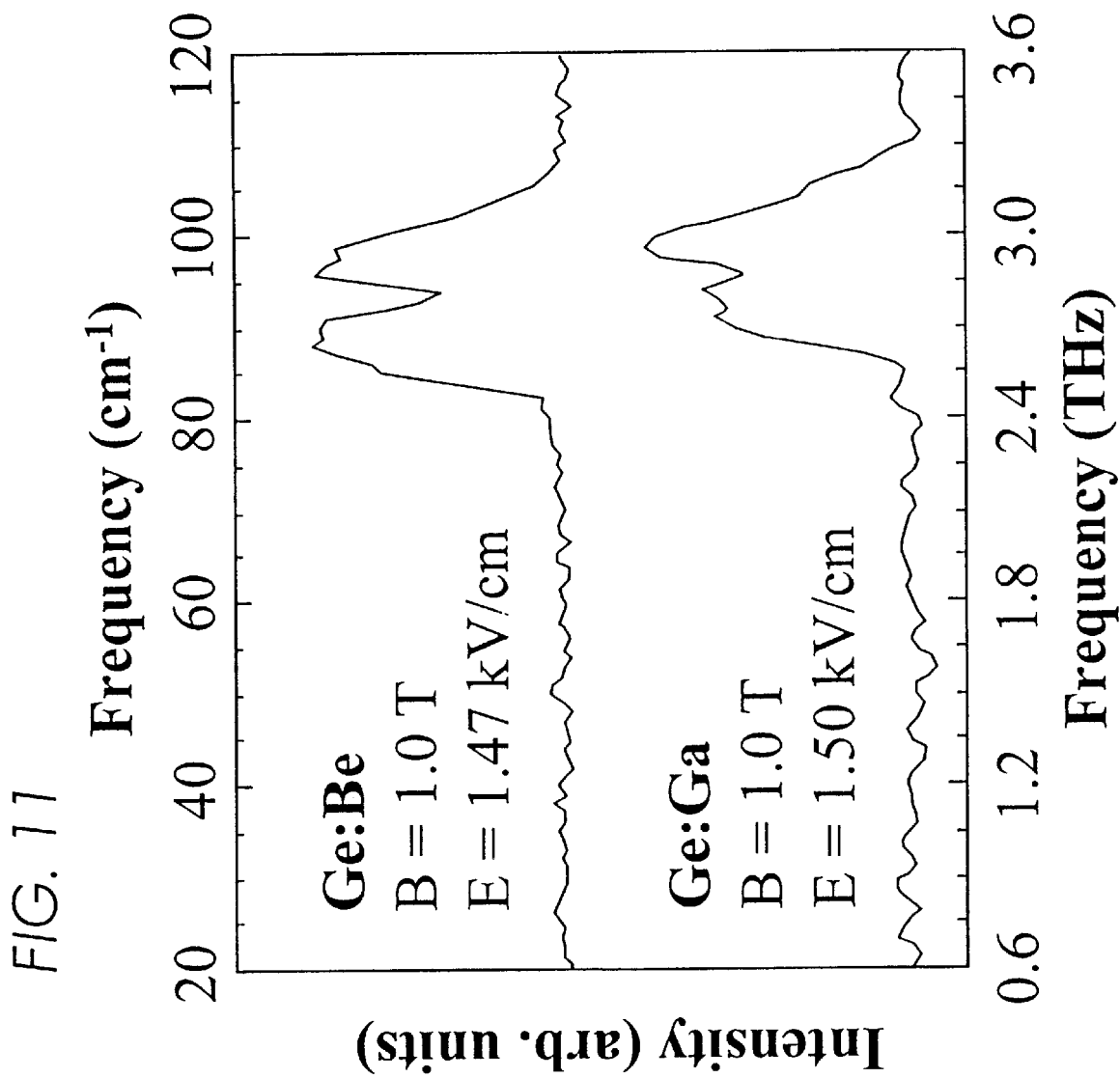
FIG. 11 shows stimulated emission from a Ge:Ga laser compared to a Ge:Be laser tested under the same conditions including crystallographic orientation with respect to the electric (E) and magnetic (B) fields.
Figure 12:
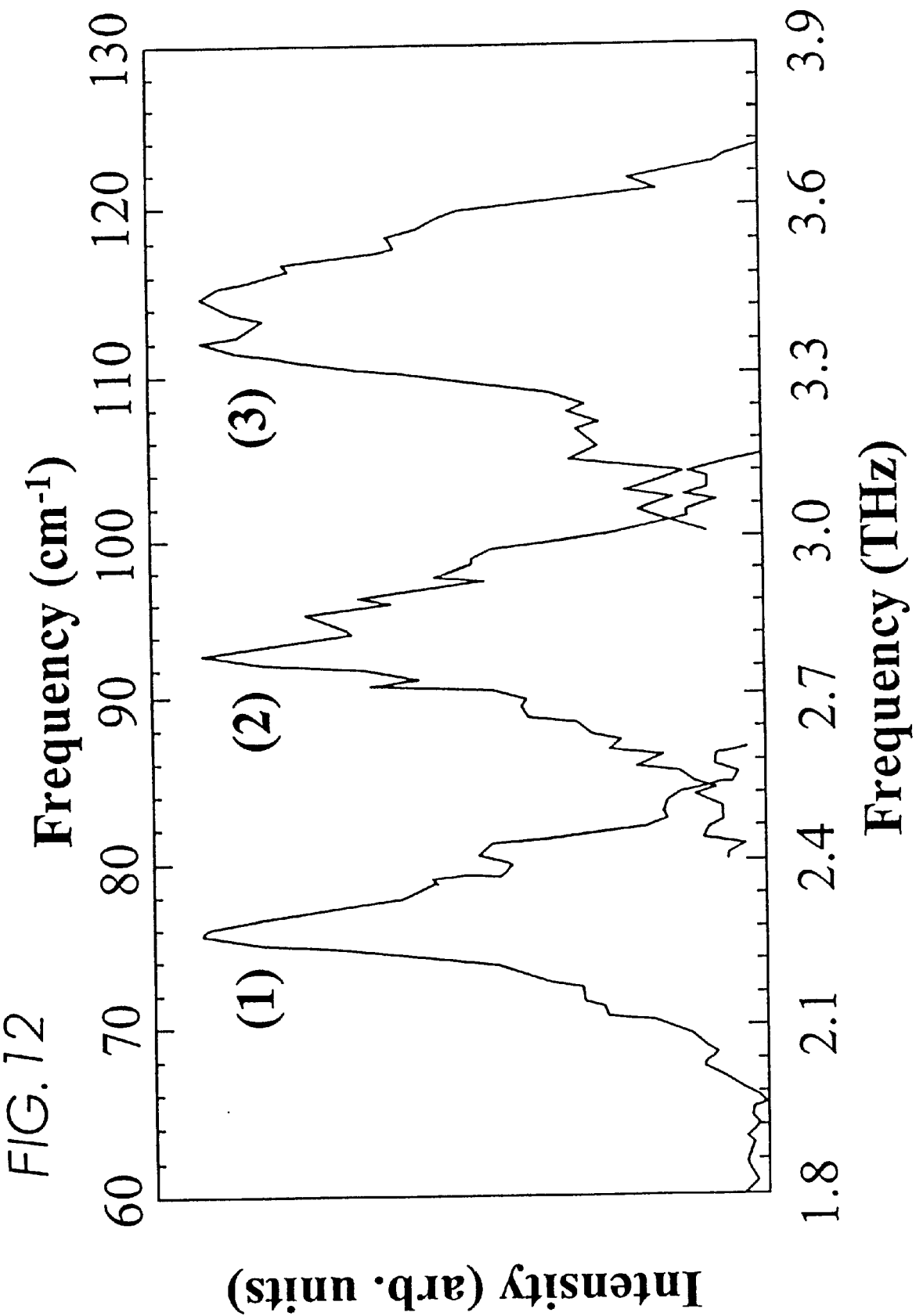
FIG. 12 shows stimulated emission spectra from a Ge:Cu laser for various combinations of electric (E) and magnetic (B) fields.

Results of these studies are shown in FIGS. 10–12.

FIG. 10 shows stimulated emission spectra from germanium:beryllium for various combinations of E and B fields. The spectral resolution in FIG. 10 is 1 cm$^{-1}$ (0.03 THz), except for the spectrum measured at 1.68 T which has a resolution of 2 cm$^{-1}$ (0.06 THz). The magnetic field was oriented parallel to the long axis of the crystal which pointed along a [110] crystallographic direction. The E field was applied along a [001] direction.

As seen from the FIG. 10, by varying the electrical and magnetic fields IVB stimulated emission throughout the range of 1 to 4 THz was achieved with beryllium. The emission of zinc doped germanium lasers (data not shown) possesses the same spectral characteristics displayed in FIG. 10. Such emission was not observed in the case of gallium-doped germanium lasers which exhibited a clear emission gap between 1.8 and 2.4 THz.

FIG. 11 shows stimulated emission from germanium:gallium, germanium doped with a shallow dopant of prior art (4×4×25 mm$^3$, gallium concentration of 8×10$^{13}$ cm$^{-3}$) compared to germanium doped with beryllium tested under the same conditions, including crystallographic orientation with respect to the E and B fields.

As seen in FIG. 11, outside the spectral region where dopant self-absorption occurs, double acceptor doping does not change the character of the emission spectrum. These results clearly demonstrate that the observed emission is related to the intrinsic properties of the germanium valence band and is not due to the nature of the dopant species.

FIG. 12 shows stimulated emission spectra from germanium:copper for various combinations of E and B fields. In this figure, the displayed emission spectra are produced by a 4.5×39.2×6.0 mm$^3$ germanium:copper laser spectral resolution of 0.5 cm$^{-1}$ (0.015 THz) was used. As in the case of the beryllium and zinc-doped samples, seen in FIG. 10, the magnetic field was oriented parallel to the long axis of the crystal along a [110] direction. However, in this case the Ohmic contacts were made on the 6.0×39.2 mm$^2$, [110]-oriented surfaces. With this configuration, stimulated emission in the range of 2.1 to 3.6 THz was observed.

In addition, when the spectrum for the same laser crystal but with the contacts oriented in a [001] direction was measured, the spectral range of the emission broadened and lasing between 1.5 and 4 THz was observed.

Neutral beryllium, zinc, and copper dopants have ionization energies of 25, 33, and 43 meV, respectively, and do not result in self-absorption. By removing the effect of dopant self-absorption and improving the power dissipation of the laser during operation, duty cycles as high as 2.5% were reached. Laser action from multivalent-acceptor-doped germanium crystals over the full range of 1 to 4 THz was achieved.

In these studies, stimulated emission from beryllium, zinc and copper-doped germanium single crystals was confirmed. Doping with the non-hydrogenic acceptors and significantly reduced shallow impurity background during crystal growth resulted in lasers that are continuously tunable from 1 to 4 THz.

V. Far Infrared Lasers Having Improved Properties

The present invention further comprises an improved solid state tunable far infrared laser. The laser is a p-type germanium crystal operated below 20 Kelvin. According to the present invention, the crystal, such as p-type germanium or silicon, is doped with deep non-hydrogenic acceptor dopants beryllium, zinc and copper, which have large hole binding energies.

The results of testing of laser properties and the apparatus for testing is shown in FIGS. 13–19.

Figure 13B:
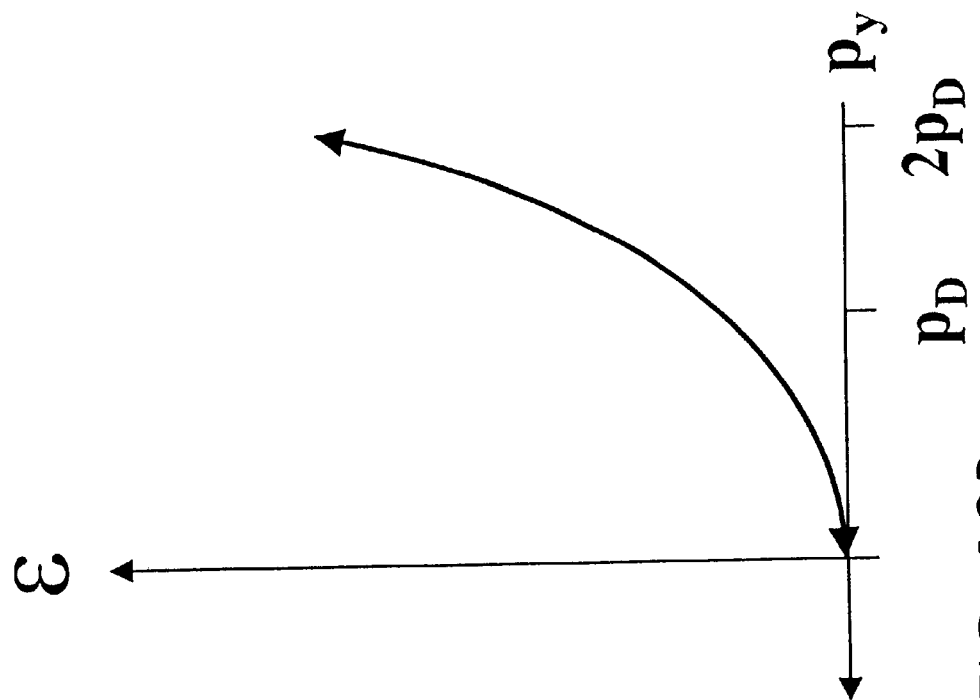
FIG. 13 shows the hole inversion formation.
Figure 13A:
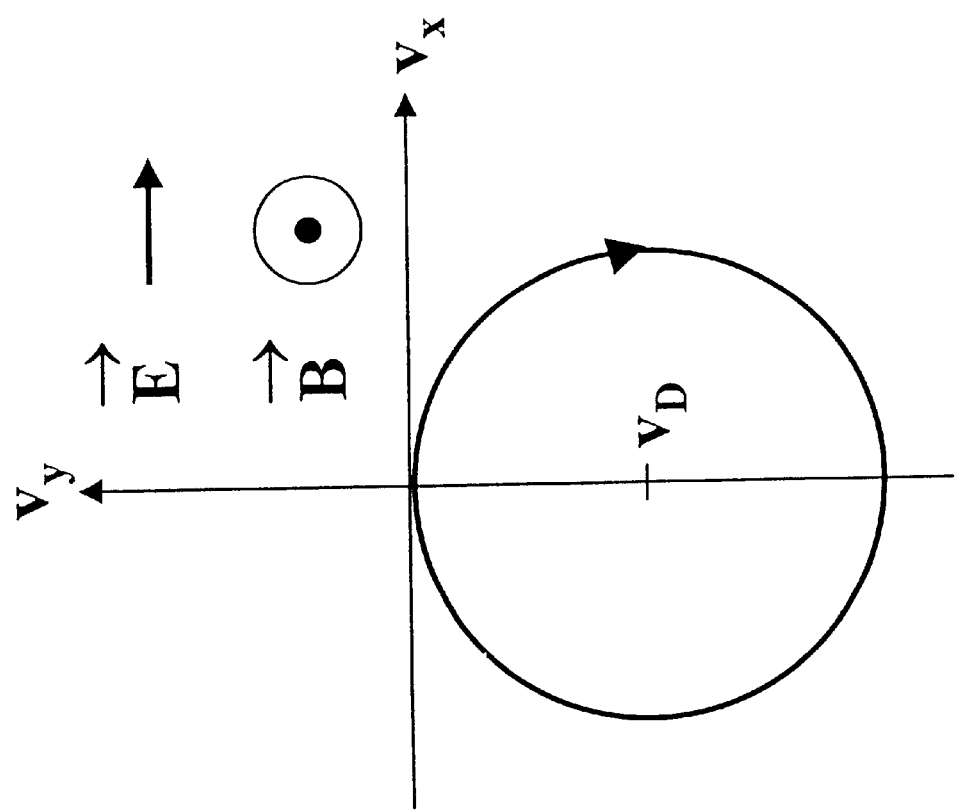

FIG. 13 shows free hole oscillation in velocity space and in the band diagram in crossed E and B fields at T=4.2K. FIG. 13A illustrates the hole inversion formation as the main trajectory of holes at 4.2K in crossed electrical E and magnetic B fields. The hole passes through the origin and surrounds the drift center $V_D$=E/B, $P_D$=m E/B (drift energy $E_D$=m$v_D^2$/2), neglecting all scattering events.

FIG. 13B shows free hole oscillation in the band energy-momentum diagram where the oscillation corresponds to an energy oscillation between zero and 2m$v_D^2$ with the effective mass m. The light hole effective mass and heavy hole effective mass determine different maximum energies for the light holes and for the heavy holes. The threshold character for optical phonon emission, which in germanium is 37 mV, is used to build inversion.

Figure 14A:
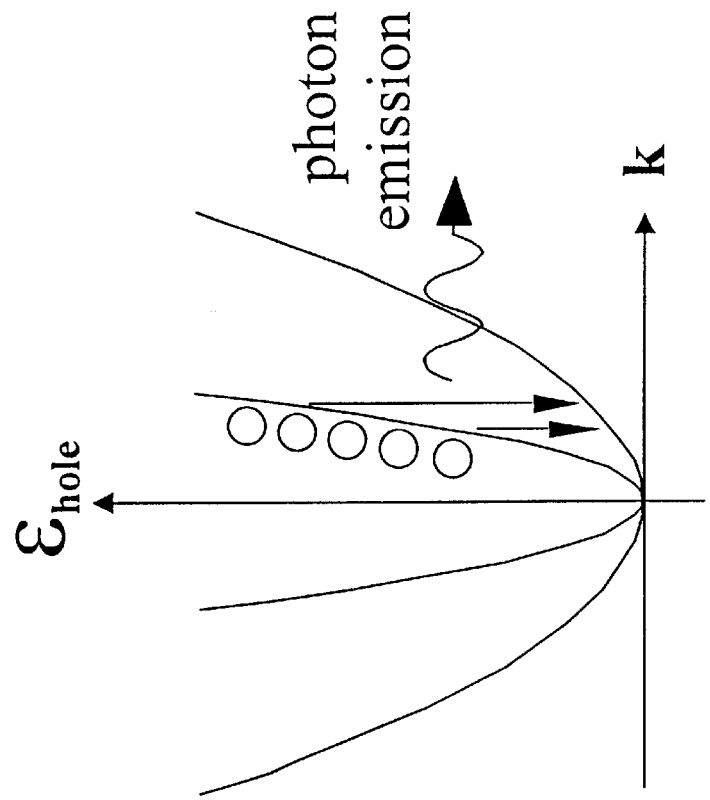
FIG. 14 shows the redistribution of light and heavy holes which leads to far-infrared emission from p-type germanium single crystals.
Figure 14B:
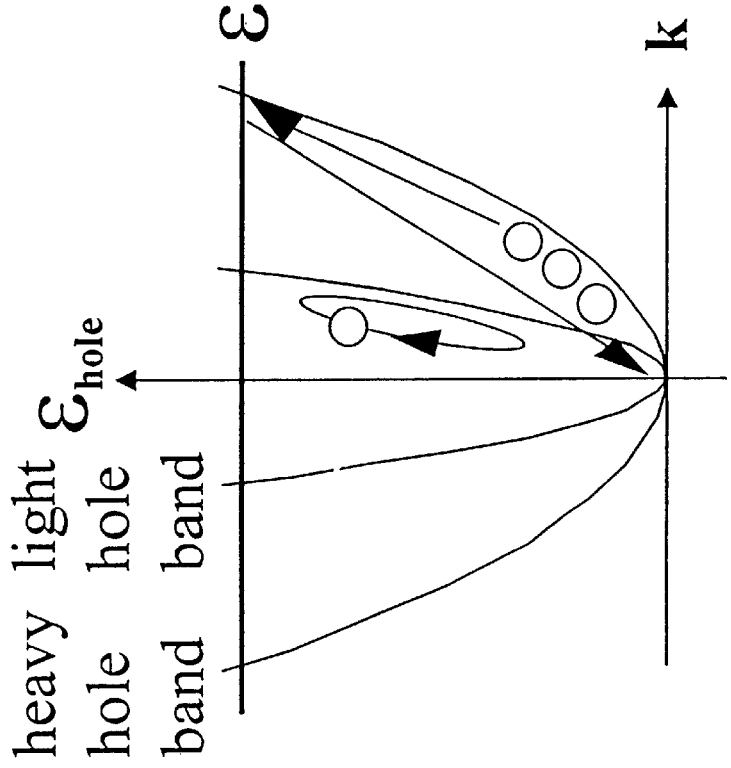

FIG. 14 shows the processes which lead to far infrared emission from p-type germanium single crystals. FIG. 14A shows the light and heavy hole band of a typical semiconductor with diamond or zinc blende crystal structure. The vertical axis is the hole energy axis, the horizontal axis is the hole crystal momentum k. Specific values for the hole masses and the optical phonon energy- are given for germanium. The process of optical phonon emission by heavy holes is schematically depicted. Because of the much larger mass, the heavy holes reach the threshold energy for optical phonon emission (37 meV) long before the light holes. The range for this situation is given by the ratio of the electric field E and the magnetic field B at the bottom of the figure. When heavy holes return after optical phonon emission (also called "scattering") to $E_{hole}$=0 and k=0, they can change their nature into light holes. Through this change in type a light hole population builds up which is larger than in equilibrium.

FIG. 14 shows that when the light hole population has increased well beyond equilibrium, some of the light holes fall back to the heavy hole band, emitting infrared photons. This stimulates other light holes from falling down to the heavy hole band, leading to stimulated emission of light, i.e., laser action.

Figure 15:
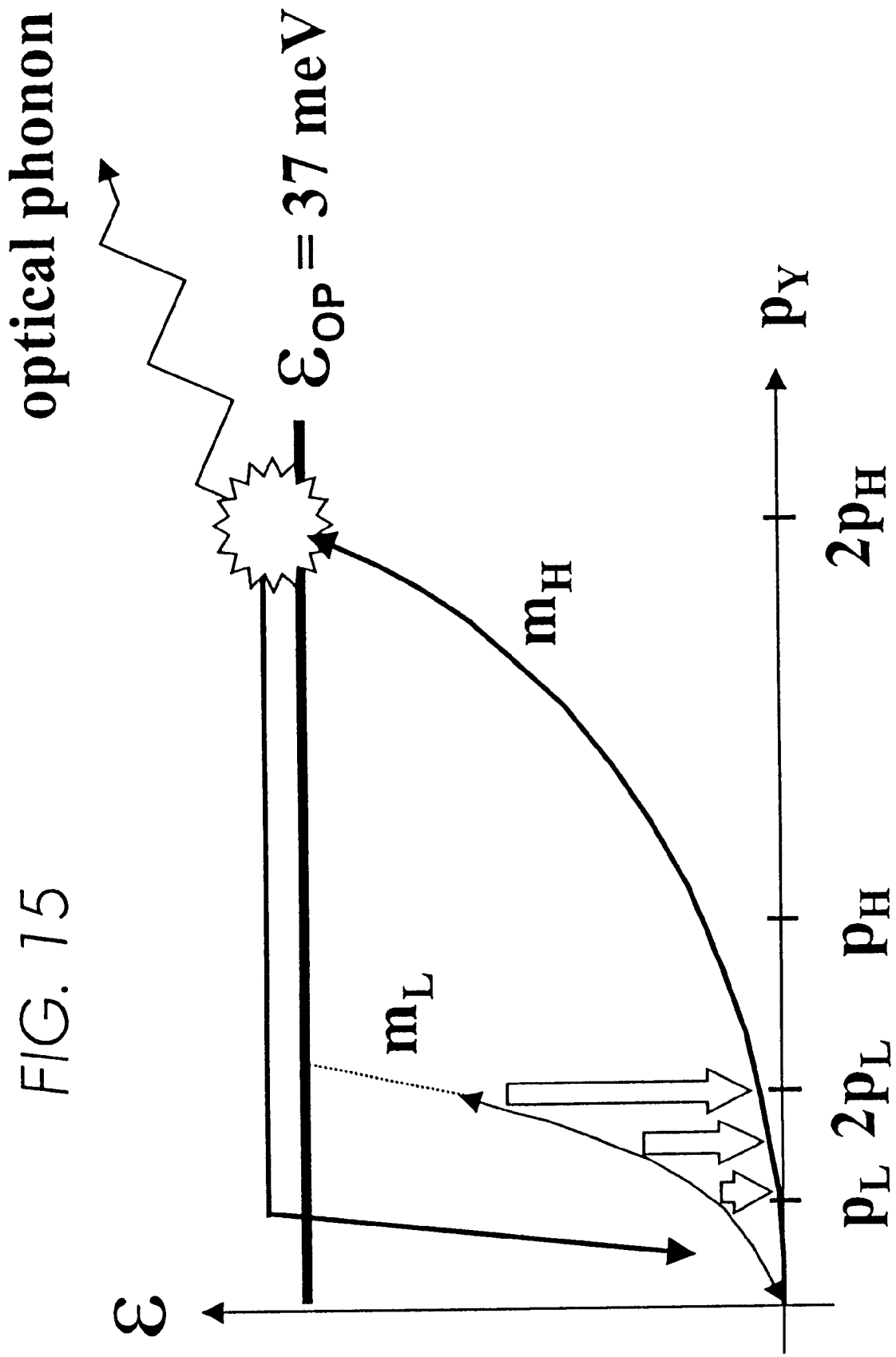
FIG. 15 shows optical phonon emission by heavy holes leading to pumping of heavy holes into the light hole band.

FIG. 15 shows inversion formation also called optical phonon scattering by pumping heavy holes into the light hole band. A population inversion results and laser emission is distributed over a wide energy range.

Figure 16:
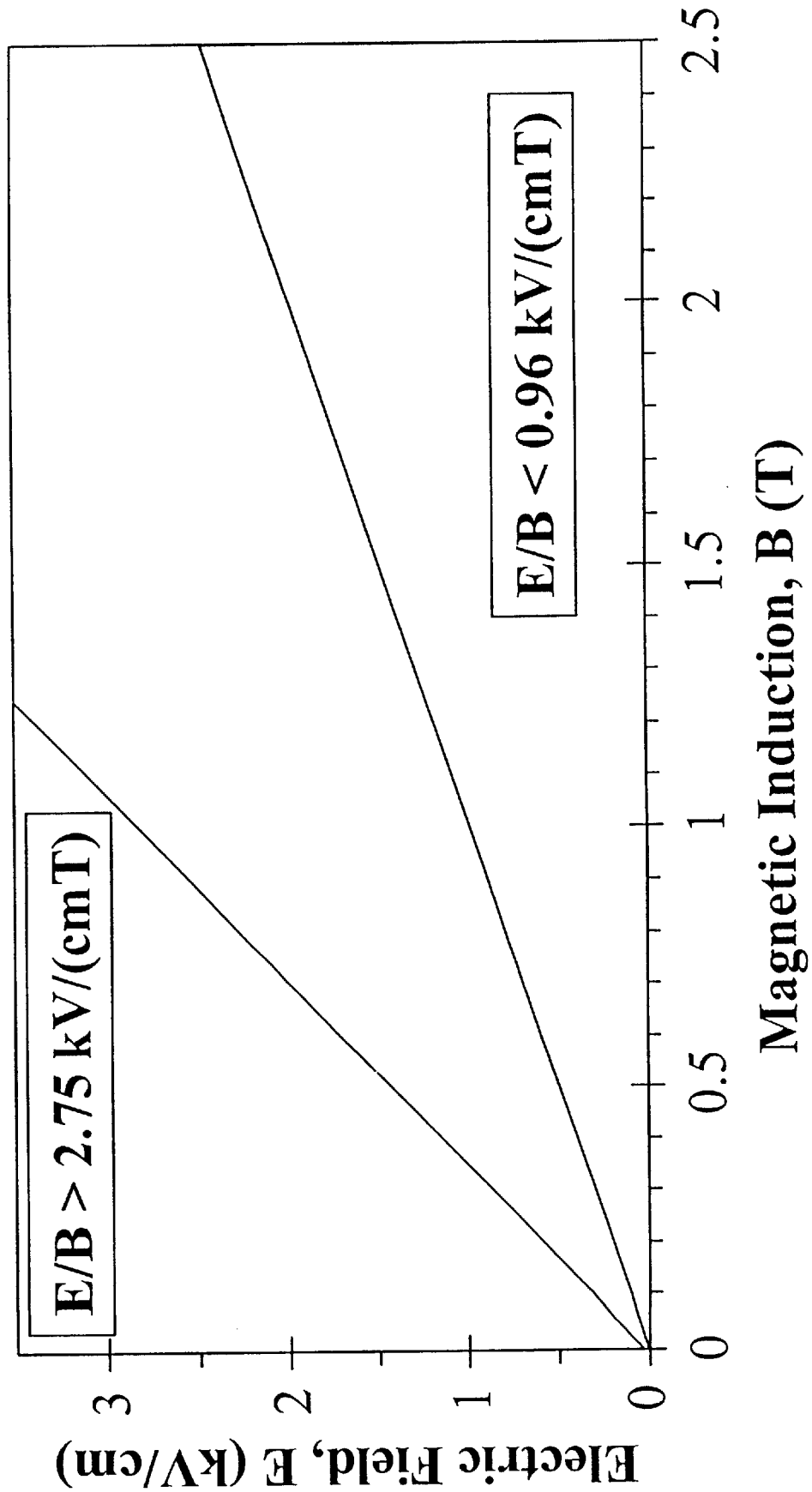
FIG. 16 shows the conditions for the E- and B- fields for heavy hole to light hole conversion given at the bottom of FIG. 14 presented here as a graph. Values in the unshaded area can lead to lasing conditions

FIG. 16 shows the condition for heavy hole to light hole conversion given at the bottom of FIG. 14 presented in this Figure as a graph. In the shaded areas no laser action can arise because either no scattering occurs (E/B<0.96 kV/cmT) or both heavy and light holes scatter (E/B>2.75 kV/cmT). The clear section is the range of E/B values which allow a population inversion to build up and which may lead to lasing.

Figure 17:
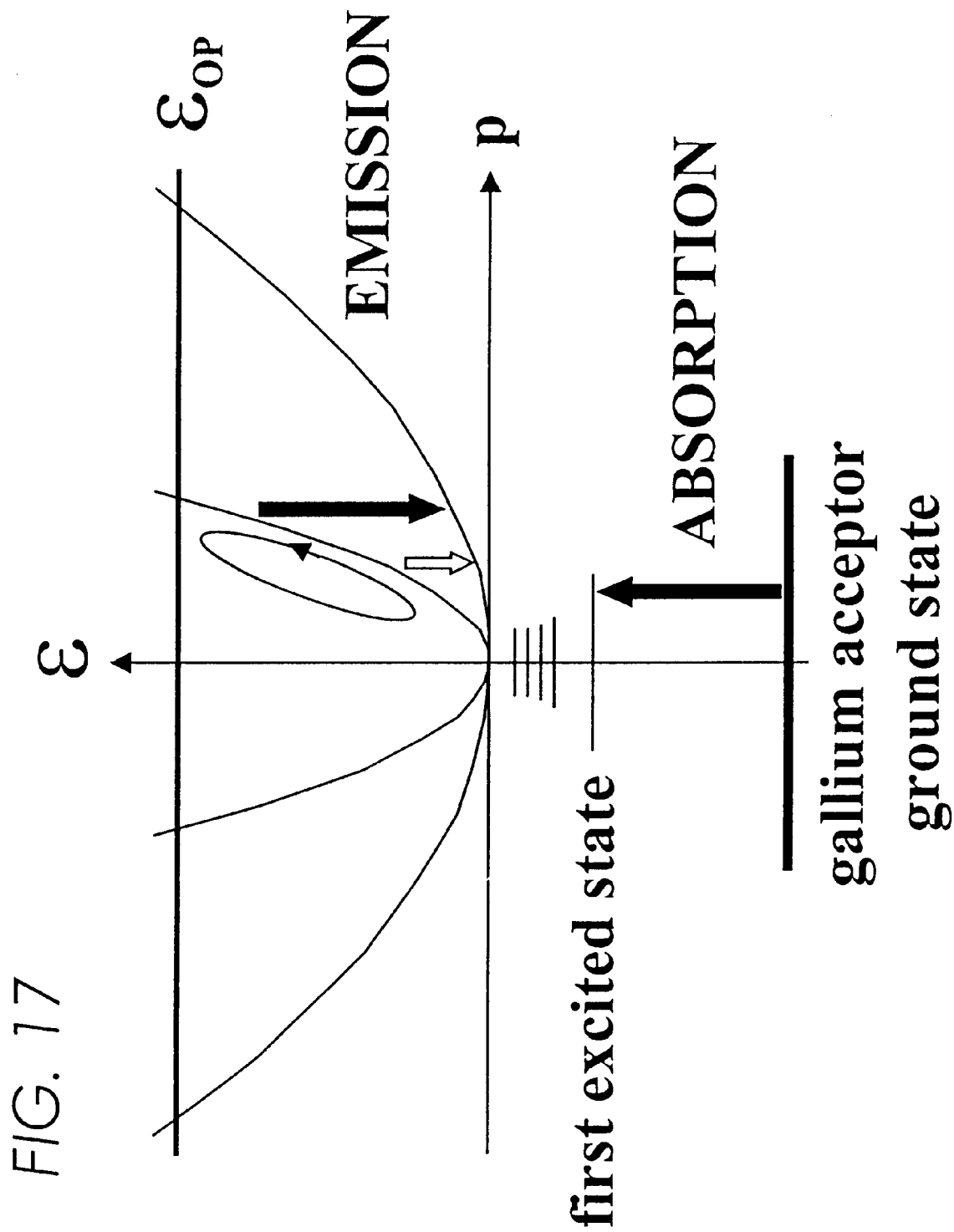
FIG. 17 shows internal radiation absorption by impurity transitions from the ground state to bound excited states.

FIG. 17 illustrates internal radiation absorption by impurity transitions from the ground state. The figure shows the region of gallium self absorption. Beryllium, zinc or copper do not fall within the self-absorption region because they are deeper acceptors.

Figure 18B:
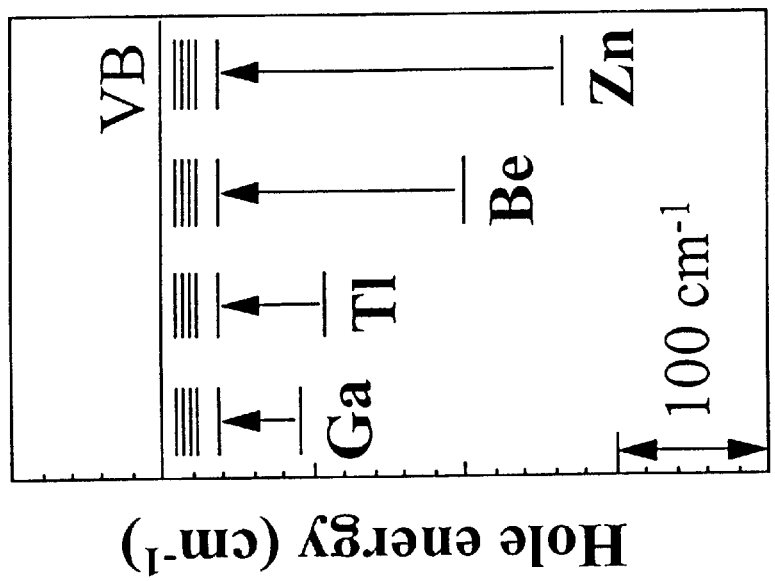
FIG. 18 shows double acceptor doped germanium.
Figure 18A:
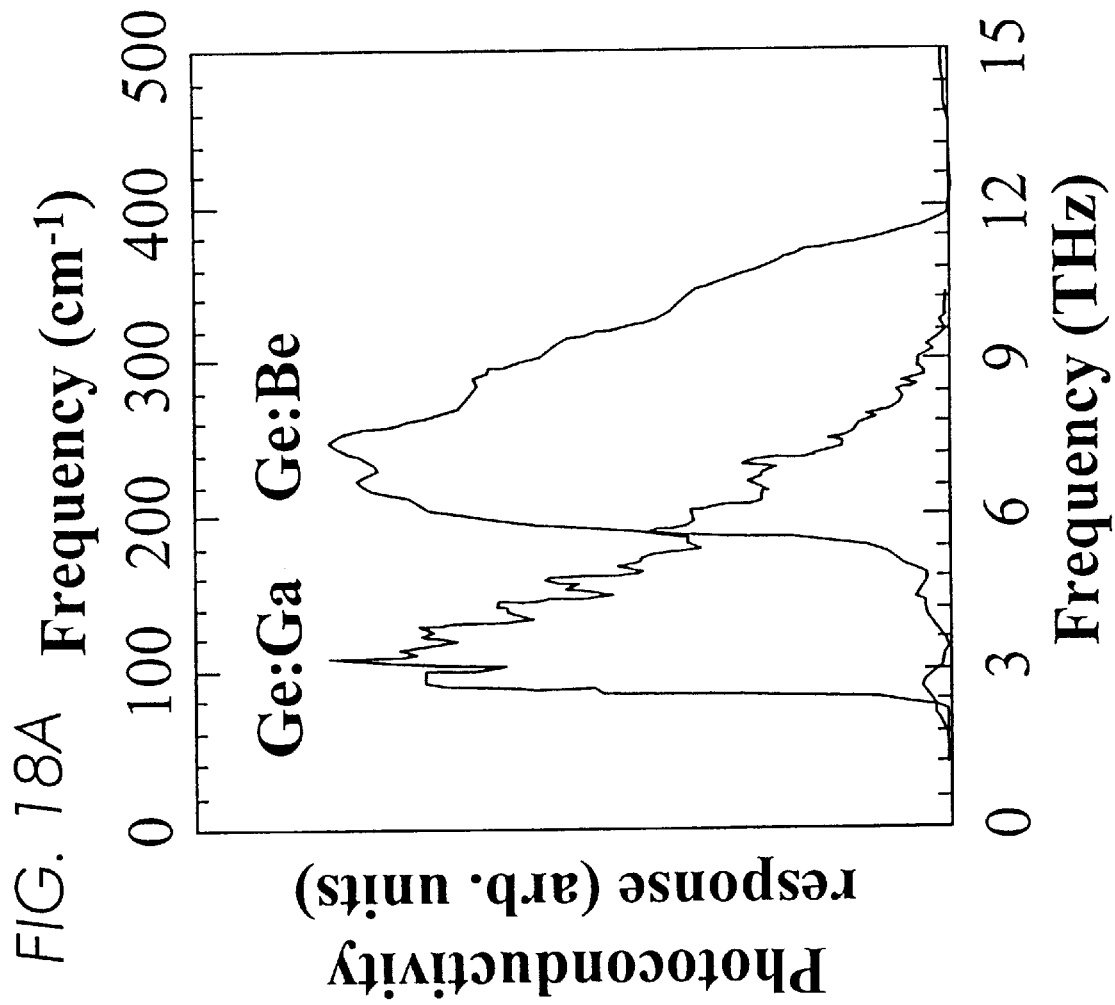
Figure 19:
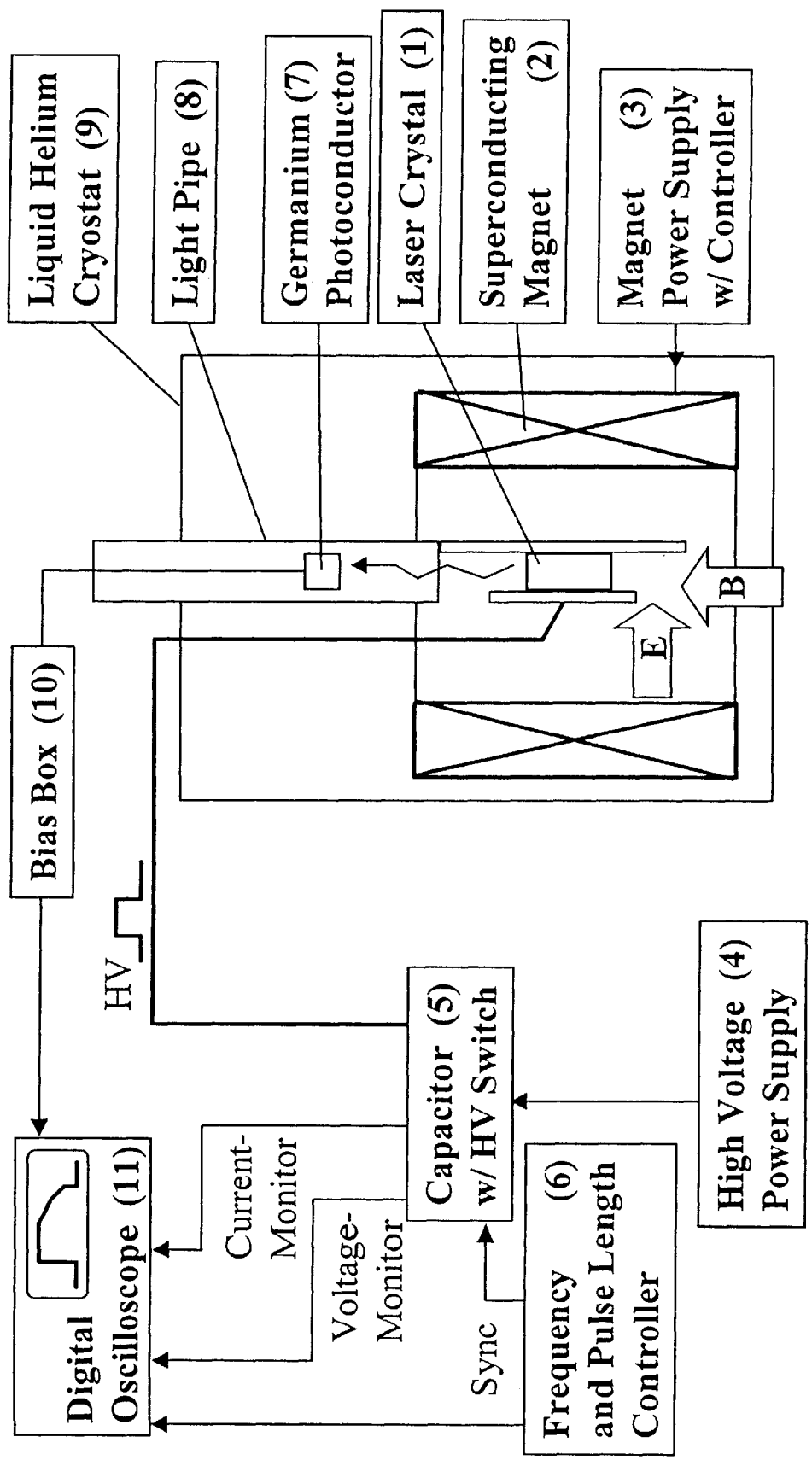
FIG. 19 illustrates a test arrangement for far-infrared hot hole semiconductor lasers.

FIG. 18 further illustrates hole energy of deeper acceptors compared to shallow acceptors, as seen in FIG. 17. When a piece of doped germanium is cooled to liquid He temperatures and is exposed to far-infrared radiation, the photons with energy larger than the hole binding energy can free the hole from its acceptor. Free holes conduct electrical current. This phenomenon, called photoconductivity, is shown in this figure for gallium-doped germanium (Ge:Ga) and beryllium-doped germanium (Ge:Be). The energy of the photon which lead to photoconductivity in germanium:beryllium is approximately 2.5 times larger than in germanium:gallium (FIG. 18A).

FIG. 18B shows a number of elements which form acceptors in semiconductors. Group III elements such as B, aluminum, gallium, indium and thallium (gallium and thallium shown) form shallow acceptors binding one hole with a typical energy of around 10 meV. These same elements also form acceptors in Si with larger binding energies ranging from 45 meV to over 250 meV. Elements of group II such as beryllium and zinc (shown) form double acceptors binding two holes with energies distinctly larger than shallow group III acceptors. The first hole is bound with energies ranging from 25 meV for beryllium to 90 meV for Hg while the binding energies for the second hole range from 60 meV to 230 mev.

The lasing action of the far infrared laser comprising semiconductors doped according to the invention is tested using the following procedure.

The laser crystal, typically a parallelepiped with electrical contacts on two opposing faces (1), is prepared according to Example 2. The dimensions of the crystal can range from less than 1 mm to several cm on each side. A superconducting magnet coil (2) is used to produce the magnetic induction B necessary for laser action. This superconducting coil can be replaced with permanent magnets. An electrical power supply (3) is used to feed current into the superconducting magnet coil. A high voltage power supply (4) is used to charge up a high voltage capacitor (5). A switchable high voltage capacitor (5) is used to feed a voltage to the laser crystal. This voltage produces the electric field across the laser crystal necessary for lasing action and also drives a current through the crystal. A frequency and pulse length controller (6) is used to determine the electric field pulse length and pulse repetition frequency. A synchronization pulse (sync) is sent to the digital oscilloscope (11). A gallium-doped germanium photoconductor (7) (germanium:gallium) is used to detect the laser signal. A metal light pipe (8) feeds the laser radiation from the laser crystal (1) to the photoconductor (7) and it shields the detector from external electrical disturbances. The laser crystal (1), detector (7) and magnet (2) are located inside a liquid He cryostat (9). The bias box (10) supplies a small voltage to the photoconductive detector (7) to produce a photocurrent signal. A high speed digital oscilloscope (11) displays the various pulse shapes including the laser voltage and current as well as the detector signal.

Due to the current invention, the size of the active laser material was reduced by more than one order of magnitude to about 20–25 mm$^3$ or even smaller. The smaller volume of the laser decreases the power consumption while increasing the duty cycle to about $10^{-4}$. Use of the dopants and improvement of the heat transfer allowed reaching a duty cycle of 2.5%. A tunability from 1 to 4 THz was achieved and the resulting continuous wave laser operates with a milliwatt (mW) rather than hundreds of watts power level.

Improvement of the far infrared laser is due to several factors. One of the limitations of prior laser for continuous wave operation is the high electrical power input into a germanium crystal typically as high as 100 W/mm$^3$. The current invention requires only about 10 W/mm$^3$. The active germanium material of the prior lasers required about 250 mm$^3$ volume. The current laser has a volume of the active germanium material decreased by more than one order of magnitude to about 25 mm$^3$ or less. An increased duty cycle of $10^{-4}$–$10^{-3}$ was achieved primarily due to the lower power input which decreased from 100 W/mm$^3$ to less than 10 W/mm$^3$. Typical germanium lasers used previously were doped with shallow hydrogenic acceptors of the chemical group III, such as aluminum, gallium or thallium. The line spectrum of these species in germanium consists of transitions between 6 and 12 meV which lie in the spectral emission range of the laser leading to self-absorption. The current invention utilizes germanium lasers doped with beryllium, zinc and copper acceptors which have hole binding energies of 25 meV, 33 meV and 43 meV, respectively. Removing shallow acceptor transitions from the laser gain spectrum results in a reduced electrical power density allowing, for example, the germanium:zinc laser to operate at 10 W/mm$^3$.

Due to a low doping concentration of $2 \times 10^{13}$ cm$^{-3}$ and low electrical power input, the improved lasers operates at duty cycles of about 0.6%.

The reduced size of the improved laser crystals leads to lower demands on power supplies and on the size of the magnets and makes table-top closed cycle cryostats viable for laser operation.

UTILITY

The method for doping germanium crystals with double or triple acceptor dopants according to the invention has significantly reduced self-absorption and enabled producing the intervalence band lasers having improved duty cycle from 1 in $10^5$ to 2.5 in $10^2$. Using the current technology the improved duty cycle reaches or is close to reaching continuous wave operation. Since the intervalence band laser is the only compact, tunable far infrared range laser source, the improvement in its properties broadens significantly a range of its applications. The intervalence band lasers having improved properties according to the invention are useful for astronomy, astrophysics, cosmology, solid state physics, chemistry and material testing, such as for example insulator extrusion for high voltage cables, etc.

EXAMPLE 1

Characterization of Germanium Crystals and Fabrication of Lasers

This example describes the preparation and characterization of germanium crystals used for doping with double and triple acceptor dopants.

Germanium crystals were Czochralski-grown p-type germanium crystals listed in Table 1, above. Crystals L1–L5 were characterized by variable temperature Hall effect measurements from 300 to 6 K, according to *Journal of Applied Physics* 45(9), 3949–54 (1974). The compensation level for all crystals was less than 1%. All crystals were grown in vacuum except for crystal L4 which was grown in a deuterium ($D_2$) atmosphere. Crystals L1 and L2 were cut from the same ingot and contained residual group III acceptors with a concentration of $1 \times 10^{12}$ cm$^{-3}$ which are partially compensated by $3 \times 10^{11}$ cm$^{-3}$ donors. Crystal L3 was deliberately counter-doped with phosphorus donors to compensate for the residual group III acceptors.

The laser crystals were cut into parallelpipeds, then lapped in a 4-mm-SiC grit/water slurry, and etched in a 7:2:1 mixture of $HNO_3$:HF:$HNO_3$ (red fuming). Ohmic contacts were formed by implantation of boron with a dose of $1 \times 10^{14}$ cm$^{-2}$ at 33 keV and $2 \times 10^{14}$ cm$^{-2}$ at 50 keV on two opposite surfaces. The contacts were completed by sputtering 20 nm of palladium (Pd) followed by 200 nm of gold (Au) on each side and by annealing at 300° C. for 1 hour in a $N_2$ atmosphere.

The high refractive index of germanium enabled laser operation with internal reflection modes. The L4 intervalence band emission was measured in the Faraday configuration by immersing the crystals into light helium (LHe) at 4.2 K and applying electric and magnetic fields. The pulsed electric field was varied in pulse duration and repetition rate. The DC magnetic field was applied with a superconducting coil. The laser signal was detected with a fast, highly compensated germanium:gallium photodetector and observed directly on a 500 MHz digital oscilloscope.

EXAMPLE 2

Preparation of Doped Germanium Single Crystals

This example describes the procedures used for doping germanium crystals with beryllium and zinc dopants.

A. Zone Purification of Germanium

Pure polycrystalline germanium bars of a few kg weight are purchased from commercial suppliers (e.g. Eagle-Picher Industries, Inc. in Quapaw, Okla.). The germanium bars are first zone refined to obtain the best possible purity (total electrically active impurity concentration in the zone refined bar should be <$10^{12}$ cm$^{-3}$). Zone refining of the polycrystalline germanium bar is performed in a graphite and/or inside as quartz boat with a thin carbon soot coating inside a quartz tube. A 1-inch long zone of the germanium bar is melted with a single turn radio frequency coil. The coil is moved slowly from one end of the bar to the other moving the molten zone along. Most impurities prefer to stay in the liquid zone and are moved to the far or "dirty" end of the bar. During the process an inert gas such as Ar or $N_2$2 is continuously flown through the tube, preventing oxidation (germanium burns at its melting point of 936° C. in air) and to flush away impurities. The zone refining process is repeated between 10 and 25 times, always starting from the same end. Each pass will take between 5 and 10 hours. The resulting bars are cut with a diamond saw into pieces suitable for crystal growth.

B. Doping and Growth of Germanium Single Crystals

The Czochralski crystal growth technique used for the large majority of all Si crystals for the electronics industry is used for germanium single crystal growth. The crystal puller consists of a graphite susceptor in which the germanium charge is melted. Typically high-purity polycrystalline charges of 1 kg are used but much smaller and much larger charges can be used with the appropriate equipment.

The susceptor is heated by a radio frequency field generated by a radio frequency generator. Depending on the desired doping concentration (to lie between $5 \times 10^{12}$ cm$^{-3}$ and $5 \times 10^{15}$ cm$^{-3}$) in the final crystal, a small piece of highly doped germanium with beryllium doping or zinc doping around $10^{18}$ cm$^{-3}$, with a predetermined weight is added to the high-purity germanium charge. The germanium charge and the small doping piece are melted at around 936° C. in a vacuum or an ultra-pure $H_2$ atmosphere. After equilibration for 15–30 minutes, a crystalline seed of germanium is lowered to touch the melt surface. The liquid germanium melt begins to freeze onto the seed and crystal growth begins. The seed is rotated at a few revolutions per minute and slowly retracted vertically until the whole melt has been transformed into a single crystal. This process may take from 1.5 to 3 hours. Special precautions for beryllium doping must be taken regarding any traces of oxygen ($O_2$ and $H_2O$) because of the extremely strong binding of beryllium and oxygen. Oxidized beryllium does not form a double acceptor in germanium or Si. After cooling down to room temperature, the crystal is cut from the seed with a diamond tool.

C. Characterization of the Beryllium or Zinc-Doped Germanium Crystal

The first rough determination of the dopant concentration is made by passing a constant electrical current I between 1 and 100 mA through the crystal and at the same time measuring the voltage drop $\Delta V$ between contacts of indium/gallium rubbed onto the surface at 1-centimeter intervals. The conductivity is found to be $$\sigma = \frac{I}{\Delta V \cdot A} \quad (1)$$

with A=cross section of the crystal at the point of measurement. The conductivity is equal to the product of the charge of the electron e, the mobility $\mu$ and the free hole concentration p $$\sigma = e \mu p. \quad (2)$$

In the case where all the dopant acceptors with concentration $N_A$ have given up a hole, we find:

$$p = N_A \text{ (cm}^{-3}). \quad (3)$$

The effect of compensation by donors may be neglected because the latter is typically over 100 times smaller than the deliberately added acceptor concentration. Combining equations 1, 2 and 3, we find:

$$N_A = \frac{\sigma}{e \cdot \mu} = \frac{I}{\Delta V \cdot A \cdot e \cdot \mu} \quad (4)$$

Figure 20:
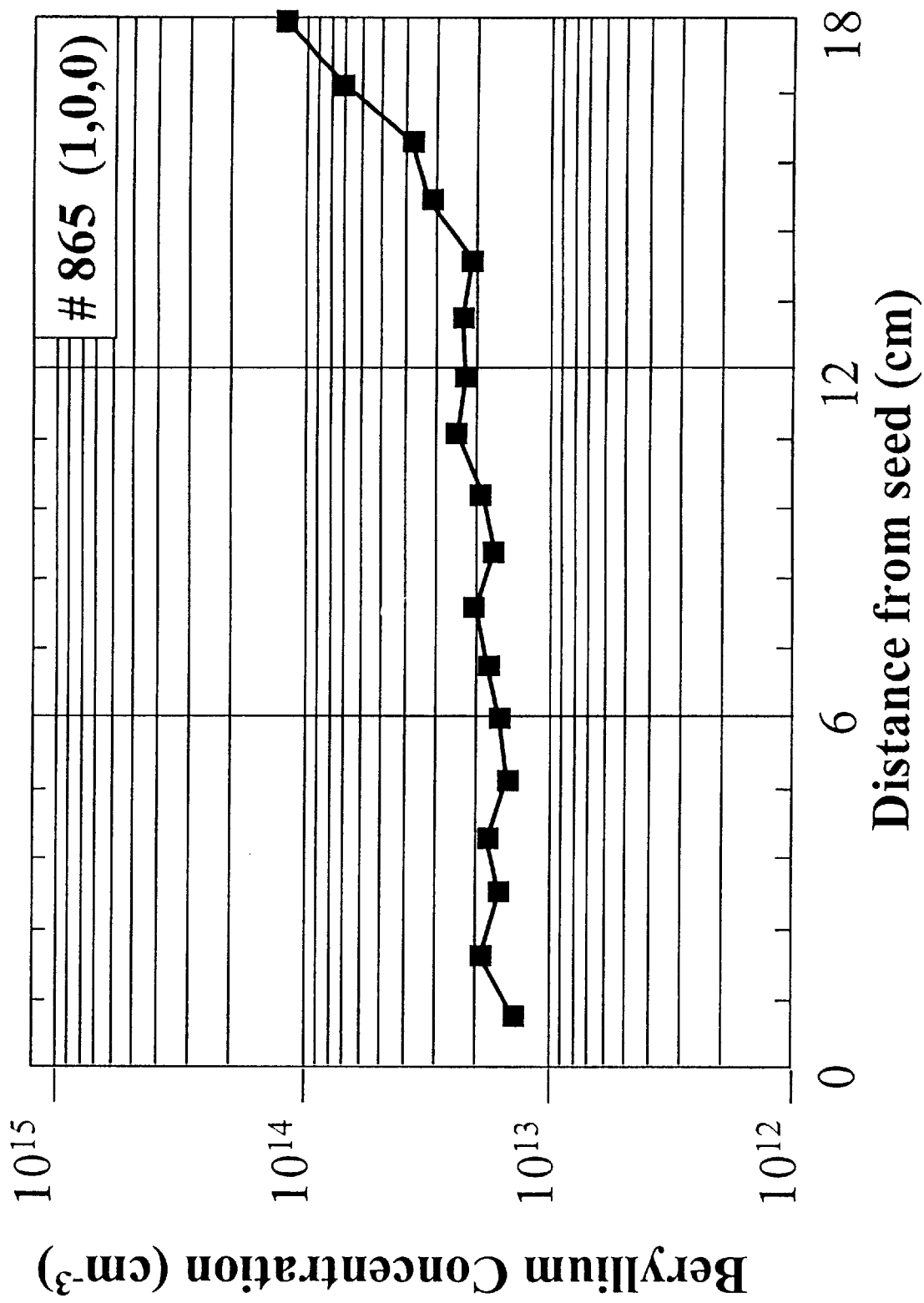
FIG. 20 shows a typical Be concentration profile of a beryllium-doped germanium crystal.

The mobility of holes in lightly doped germanium at room temperature is approximately 1900 $cm^2 V^{-1} s^{-1}$. FIG. 20 shows a typical concentration profile of a beryllium doped germanium single crystal.

Further characterization with Hall effect measurements (referenced above) and infrared spectroscopy are performed to accurately determine the doping concentration of the deliberately added dopants as well as the residual impurities.

EXAMPLE 3

Stimulated Far-Infrared Emission from Combined Cyclotron Resonances in Germanium This example describes experimental set-up for studies of stimulated far-infrared emission from combined cyclotron resonances in germanium crystals doped with beryllium and zinc.

For this study, samples from two Czochralski-grown single crystals, one doped with beryllium and the other with zinc according to the Example 1 and 2 were used. Lasers were produced from wafers. The wafers were characterized by variable temperature Hall-effect measurements and by photothermal ionization spectroscopy. The double acceptor concentrations for both crystals were determined to be $1.5 \times 10^{14}$ $cm^{-3}$ and a residual net shallow acceptor concentration of 1 to $2 \times 10^{12}$ $cm^{-3}$. The laser samples were mounted between two copper electrodes and placed inside a superconducting magnet in a liquid helium cryostat. Electric field pulses with lengths of 1 to 2 $\mu s$ were applied. The high refractive index of germanium enabled laser operation without external resonators by internal reflection modes.

The radiation was detected in the Faraday configuration with the outcoupling direction parallel to the magnetic field. The emission spectra were measured by Fourier transform spectroscopy using a Michelson interferometer and a broadband 4.2 K bolometer.

EXAMPLE 4

Stimulated Far-Infrared Emission from Copper-Doped Germanium Crystals

This example describes studies performed to investigate stimulated far-infrared emission from copper-doped germanium single crystals.

Germanium wafers 4–6 mm thick were cut from a Czochralski-grown, p-type germanium ingot with a residual shallow acceptor concentration of $2 \times 10^{11}$ $cm^{-3}$. These wafers were lapped in a 600 mesh SiC powder/water slurry and polish etched in a 4:1 $HNO_3$:HF mixture. Angstroem (or Å) 1000 A layer of copper was rf sputtered onto the wafers as a diffusion source. The wafers were crystallographically oriented and cut with a diamond saw to produce sample geometries with dimensions slightly larger than the final device. The dimensions of these geometries are seen in Table 2.

Each laser crystal was cleaned and annealed separately in an ampoule sealed under vacuum. In-diffusion of copper was performed for 40 hours at a fixed temperature ranging from 600 to 700° C. This temperature was selected because in this temperature range, the solubility of substitutional copper acceptors is known to vary from about 4 to $40 \times 10^{14}$ $cm^{-3}$. The ampoules were quenched rapidly in ethylene glycol to reach the desired concentrations of substitutional copper in the laser crystals depending on the annealing temperature seen in Table 2.

The concentration of substitutional copper acceptors was determined by Hall effect measurements because these acceptors are not compensated. Obtained measurements have shown that the homogeneity of the copper acceptors were better than 20% for each annealing temperature. These measurements revealed a residual shallow acceptor net concentration in the low $10^{12}$ $cm^{-3}$ range which was approximately five times higher than the concentration measured for unannealed samples.

Upon completion of copper in-diffusion and characterization of the annealed crystals, the laser crystal surfaces were lapped sequentially in 600 and 1900 mesh SiC power/water slurries and polish etched in a 4:1 $HNO_3$/HF mixture. Ohmic contact were formed on two opposite surfaces by B implantation with doses of $1 \times 10^{14}$ and $2 \times 10^{14}$ $cm^{-2}$ at 33 and 50 kev, respectively. Then 200 Å of palladium and 4000 Å of gold were rf sputtered onto the implanted surfaces. Annealing for 1 hour at 300° C. in a $N_2$ ambient was performed to remove implantation damage and fully activate the boron acceptors in the implanted layer. Processing of a beryllium doped germanium crystal (Be14) serving as a comparison was performed in the same fashion.

The high refractive index of germanium enabled laser operation with internal reflection modes, the laser surfaces forming an internal cavity. Laser emission was measured in the Faraday configuration with the crystals immersed in liquid helium. The laser signal was detected with a fast, highly compensated germanium:gallium photoconductor or a bolometer operated at 4.2 K. Spectral measurements were performed in the range of 0–500 $cm^{-1}$ with a far-infrared Fourier transform spectrometer.

EXAMPLE 5

Terahertz Emission from p-Type Germanium Lasers Doped with Acceptors

This example describes studies performed to determine stimulated emission from germanium single crystals doped with multivalent acceptors beryllium, zinc and copper over the full range of 1 to 4 terahertz.

For this study, samples from two Czochralski-grown crystals, one doped with beryllium and the other with zinc were used. Wafers were lapped sequentially in 600 and 1900 mesh SiC power/water slurries and polish-etched in a 4:1 $HNO_3$:HF mixture. Ohmic contacts were formed on the wafer surfaces by boron ion implantation with doses of $1 \times 10^{14}$ and $2 \times 10^{14}$ $cm^{-2}$ at 33 and 50 keV, respectively. 200 A of Pd and 4000 A of Au were then rf sputtered onto the implanted surfaces. Annealing for 1 hour at 300° C. in a $N_2$ ambient was performed to remove implantation damage and activate the boron acceptors in the implanted layer.

The wafers were crystallographically oriented and cut into parallelepipeds. The freshly exposed surfaces were re-lapped, and the bar-shaped samples were re-etched in the 4:1 $HNO_3$:HF mixture.

Before laser preparation, the crystals were characterized by variable temperature Hall-effect measurements and photothermal ionization spectroscopy (PTIS) in order to determine the type and the concentration of the different impurities present in the crystals. A majority dopant concentration for both crystals of $1.5 \times 10^{14}$ cm$^{-3}$ and a residual net shallow acceptor, mostly B and Al, concentrations of 1.0 to $2.0 \times 10^{12}$ cm$^{-3}$ were determined.

Copper doping was done in germanium crystals by thermal diffusion. A 6 mm thick wafer was cut from a Czochralski-grown, p-type germanium ingot with a residual shallow acceptor concentration of $2 \times 10^{11}$ cm$^{-3}$. The wafer was lapped and etched in the manner described above. A 1000 Å layer of copper was rf sputtered onto the wafer as a diffusion source. The wafer was crystallographically oriented and cut to produce sample geometries with dimensions slightly larger than the final laser device.

Each laser crystal was cleaned and annealed separately in an ampoule sealed under vacuum. In-diffusion of copper was performed for 40 hours at a fixed temperature of 700° C. The ampoules were quenched rapidly in ethylene-glycol to reach the desired substitutional copper concentration of $1 \times 10^{15}$ cm$^{-3}$.

Reference samples 1 mm thick were cut at each end of the laser crystals to check the copper concentration, the homogeneity of copper along the length of each laser crystal and the concentration of residual shallow impurities of acceptor and donor contaminants. Hall effect measurements performed on these samples have shown the homogeneity of the copper acceptors to be better than 20%. These measurements reveal a residual shallow acceptor net concentration in the low $10^{12}$ cm$^{-3}$ range which was approximately five times higher than the concentration measured for unannealed samples. This shallow acceptor concentration increase was related, at least in part, to the dissociation of hydrogen-acceptor complexes. According to PTIS measurements, the residual acceptors were found to be aluminum and gallium impurities in a 1:1 concentration ratio. The concentration of compensating shallow donors was found to be in the low $10^{11}$ cm$^{-3}$ range and was attributed to phosphorus impurities.

Upon completion of copper in-diffusion and characterization of the annealed crystals, the laser crystal surfaces were lapped and polish-etched to their final dimensions. Ohmic contacts were formed on two opposite surfaces in the same manner described previously.

The laser samples were mounted between two copper electrodes and placed inside a superconducting magnet in a liquid helium cryostat. Electric field pulses with lengths of 1 to 2 $\mu$s were applied. The high refractive index of germanium enabled laser operation without external resonators, the laser surfaces forming an internal cavity. The radiation was detected in the Faraday configuration with the outcoupling direction parallel to the magnetic field. The emission spectra were measured by Fourier transform spectroscopy using a Michelson interferometer and a broadband 4.2 K bolometer.

EXAMPLE 6

Fabrication of Laser Specimens

Germanium laser fabrication starts with cutting of a slice of appropriate thickness from a doped crystal. The thickness may vary from below 1 mm to several cm. A diamond saw is used for this process. The cylindrical wafer is mounted on a graphite block and parallelepipeds are cut in specific crystal orientations. The dimensions of the parallelepipeds may range from below 1 mm to over several cm along each axis. The diamond cut surfaces are then lapped in a 1900 mesh alumina or silicon carbide and water slurry. Chemical etching in a mixture of HF:HNO$_3$-1:4 removes all the lapping roughness leading to a defect-free shiny germanium parallelepiped. Boron ion implantation followed by standard Pd and Au thin film metallization is used to form the electrical contacts on two opposing faces. At this point, the crystal is ready for application of current leads and cooling fins and insertion into the liquid He cryostat.

We claim:
1. A far infrared tunable hot-hole laser comprising
   (a) a doped semiconductor,
      wherein said semiconductor is a germanium, silicon, silicon carbide, diamond, gallium arsenide, gallium phosphide, zinc selenide, or cadmium telluride crystal doped with a non-hydrogenic acceptor dopant having binding energies larger than the laser photons,
      wherein said acceptor dopant is selected from the group consisting of a Group I and Group II element,
      wherein said doped semiconductor crystal is cut into parallelepipeds, lapped and polish-etched; and
   (b) electric p-type contacts,
      wherein said electric contacts are formed by a dopant ion implantation,
      wherein the dopant implanted surfaces are rf-sputtered with a metal, and
      wherein the implanted dopants within the semiconductor are activated by annealing at about 300° C. temperature in about one hour.
2. The laser of claim 1 wherein the acceptor dopant is the Group I element.
3. The laser of claim 2 wherein the acceptor dopant is copper introduced into the semiconductor crystal by in-diffusion.
4. The laser of claim 1 wherein the acceptor dopant is the Group II element.
5. The laser of claim 4 wherein the acceptor dopant is beryllium or zinc introduced into the semiconductor crystal in the melt before crystal growth.
6. The laser of claim 1 having a continuous tunability from 1 to 4 Thz.
7. The laser of claim 6 wherein a size of active laser material is less than 25 mm$^3$.
8. A far infrared tunable laser, based on intervalence or intravalence band or on Landau level transitions operated in a magnetic field, said laser comprising:
   a) a p-type single crystal doped with a non-hydrogenic acceptor dopant, wherein the crystal is doped by growing from a doped melt, or by in-diffusion;
   b) electrical contacts for applying a voltage enabling a light hole current flow which is perpendicular to the applied magnetic field, wherein said electrical contacts are ohmic contacts on opposing faces, co-planar contacts, or multiple contacts; and
   c) the non-hydrogenic acceptor dopant having a lowest hole binding energy wherein a ground state to a bound excited state transition has energy which is above tie photon energy range of the laser transitions.
9. The laser of claim 8 operated in an electrically pulsed, modulated excitation or a continuous mode.
10. The laser of claim 8 wherein the crystal is germanium.
11. The laser of claim 10 wherein the acceptor dopant is a single species of a non-hydrogenic acceptor or a mixture thereof or an acceptor with a lowest hole binding energy wherein said lowest hole binding energy is larger than 20 meV.
12. The laser of claim 1 wherein the acceptor dopant is a group II element or a double acceptor.

13. The laser of claim 12 wherein the acceptor dopant is beryllium.

14. The laser of claim 12 wherein the acceptor dopant is zinc.

15. The laser of claim 11 wherein the acceptor dopant is a group I element or a triple acceptor.

16. The laser of claim 15 wherein the acceptor dopant is copper.

17. The laser of claim 8 wherein the crystal is silicon.

18. The laser of claim 17 wherein the acceptor dopant is a single species of non-hydrogenic acceptor or a mixture thereof or an acceptor with a lowest hole binding energy wherein said lowest hole binding energy is larger than 50 meV.

19. The laser of claim 18 wherein the acceptor dopant is a group II element or a double acceptor.

20. The laser of claim 19 wherein the acceptor dopant is beryllium.

21. The laser of claim 19 wherein the acceptor dopant is zinc.

22. The laser of claim 18 wherein the acceptor dopant is a group I element or a triple acceptor.

23. The laser of claim 22 wherein the acceptor dopant is copper.

24. The laser of claim 8 wherein the crystal is diamond, a group IV—IV crystal, a group III–V crystal, a group II–VI compound, or an alloy thereof.

25. The laser of claim 24 wherein the acceptor dopant is a single species of non-hydrogenic acceptor or a mixture thereof or an acceptor with the lowest hole binding energy wherein said lowest hole binding energy is larger than 20 meV.

26. The laser of claim 24 wherein the group IV—IV crystal is silicon-germanium or silicon-carbide, wherein the group III–V crystal is gallium-arsenide or gallium-phosphide or gallium-antimonide, wherein the group II–VI crystal is zinc-selenide or cadmium-telluride, or an alloy thereof.

27. A method for lasing using a far infrared tunable hot hole laser, said method comprising steps:

(a) manufacturing the far infrared tunable laser comprising:

a p-type single crystal doped with a non-hydrogenic acceptor dopant selected from the group consisting of a Group I and Group II element, wherein said crystal is doped by growing from a doped melt or by in-diffusion;

electrical contacts for applying a voltage enabling a light hole current flow which is perpendicular to the applied magnetic field, wherein said electrical contacts are opposing ohmic contacts on opposing faces, co-planar contacts, or multiple contacts; and the non-hydrogenic acceptor dopant which has a lowest hole binding energy, wherein a ground state to a bound excited state transition has energy which is above the photon energy range of the laser transitions;

(b) mounting said laser between two copper electrodes;

(c) placing said mounted laser inside a superconducting magnet;

(d) applying electric field pulses;

(e) detecting the radiation in the Faraday configuration with the outcoupling direction parallel to the magnetic field; and (f) measuring the emission spectra.

* * * * *